(12) United States Patent
Park et al.

(10) Patent No.: US 11,774,234 B2
(45) Date of Patent: Oct. 3, 2023

(54) ANGLE SENSOR CALIBRATION METHOD FOR SAFETY MEASURE WITHOUT FULL ROTATION

(71) Applicant: Infineon Technologies AG, Neubiberg (DE)

(72) Inventors: Joo Il Park, Sungnam (KR); Sehwan Kim, Suwon-Si (KR); Hyun Jeong Kim, Seoul (KR)

(73) Assignee: Infineon Technologies AG, Neubiberg (DE)

( * ) Notice: Subject to any disclaimer, the term of this patent is extended or adjusted under 35 U.S.C. 154(b) by 120 days.

(21) Appl. No.: 17/444,340

(22) Filed: Aug. 3, 2021

(65) Prior Publication Data
US 2023/0041763 A1 Feb. 9, 2023

(51) Int. Cl.
*G01R 33/02* (2006.01)
*G01B 7/30* (2006.01)
*G01R 33/00* (2006.01)

(52) U.S. Cl.
CPC ........... *G01B 7/30* (2013.01); *G01R 33/0017* (2013.01)

(58) Field of Classification Search
CPC .............................. G01B 7/30; G01R 33/0017
See application file for complete search history.

(56) References Cited

U.S. PATENT DOCUMENTS

2008/0067346 A1* 3/2008 Amster ............... H01J 49/0009
250/282
2019/0041209 A1* 2/2019 D'Alfonso ......... G01R 33/0017

* cited by examiner

*Primary Examiner* — Alesa Allgood
(74) *Attorney, Agent, or Firm* — Harrity & Harrity, LLP

(57) ABSTRACT

In some implementations, a sensing device associated with less than a 360 degree measurement range may obtain a set of signal values. The sensing device may be configured to sense a magnetic field present at the sensing device and collect sensor data based on the magnetic field. The set of signal values may be included in the sensor data collected by the sensing device and may correspond to one or more components of the magnetic field present at the sensing device. The sensing device may determine, based on the set of signal values, a set of calibration points and a set of angular positions. The sensing device may calculate a set of calibration parameters based on the set of calibration points and the set of angular positions. The sensing device may utilize the set of calibration parameters to perform one or more safety checks.

20 Claims, 19 Drawing Sheets

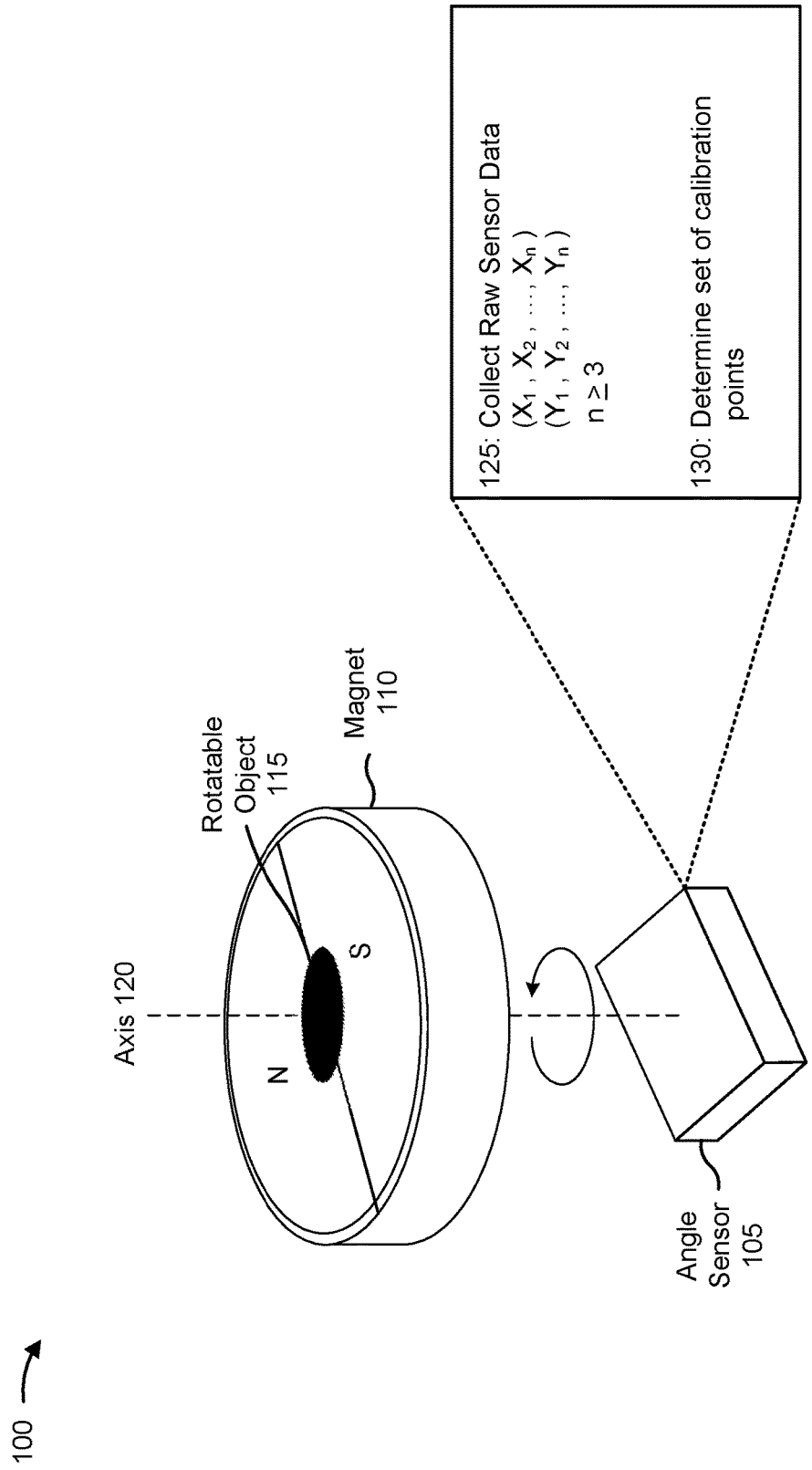

ANGLE SENSOR CALIBRATION METHOD FOR SAFETY MEASURE WITHOUT FULL ROTATION

BACKGROUND

An angle sensor may include a set of sensing components that sense a strength of different components (e.g., an x-component and a y-component) of a magnetic field produced or distorted by a target object. The angle sensor may determine an angular position of the target object based on the strength of the components of the magnetic field and may provide an output that indicates the angular position as determined by the angle sensor.

SUMMARY

In some implementations, a method includes obtaining, by a sensing device, a set of signal values, the sensing device being configured to sense a magnetic field present at the sensing device and collect sensor data based on the magnetic field, the sensor data being associated with less than a 360 degree measurement range, the set of signal values being included in the sensor data collected by the sensing device, and the set of signal values corresponding to one or more components of the magnetic field present at the sensing device; determining, by the sensing device and based on the set of signal values, a set of calibration points and a set of angular positions, each calibration point of the set of calibration points being associated with a respective angular position of the set of angular positions; calculating, by the sensing device, a set of calibration parameters based on the set of calibration points and the set of angular positions; utilizing, by the sensing device, the set of calibration parameters to perform one or more safety checks; and outputting, by the sensing device, a result of the one or more safety checks.

In some implementations, an angle sensor includes one or more sensing elements configured to: sense a magnetic field present at the one or more sensing elements; and collect sensor data based on the magnetic field, the sensor data being associated with less than a 360 degree measurement range; and one or more processors configured to: obtain a set of signal values, the set of signal values being included in the sensor data collected by the one or more sensing elements, and the set of signal values corresponding to one or more components of the magnetic field present at the one or more sensing elements; determine, based on the set of signal values, a set of calibration points and a set of angular positions, each calibration point of the set of calibration points being associated with a respective angular position of the set of angular positions; calculate a set of calibration parameters based on the set of calibration points and the set of angular positions; utilize the set of calibration points to perform one or more safety checks; and output a result of the one or more safety checks.

In some implementations, a system includes an angle sensor configured to: sense a magnetic field present at the angle sensor; and collect sensor data based on the magnetic field, the sensor data being associated with less than a 360 degree measurement range; and one or more processors configured to: obtain a set of signal values, the set of signal values being included in the sensor data collected by the angle sensor, and the set of signal values corresponding to one or more components of the magnetic field present at the angle sensor; determine, based on the set of signal values, a set of calibration points and a set of angular positions, each calibration point of the set of calibration points being associated with a respective angular position of the set of angular positions; calculate a set of calibration parameters based on the set of calibration points and the set of angular positions; utilize the set of calibration parameters to perform one or more safety checks; and output a result of the one or more safety checks.

BRIEF DESCRIPTION OF THE DRAWINGS

FIGS. 1A-1E are diagrams of an example angle sensor calibration method for safety measure without full rotation described herein.

DETAILED DESCRIPTION

Figure 1B:
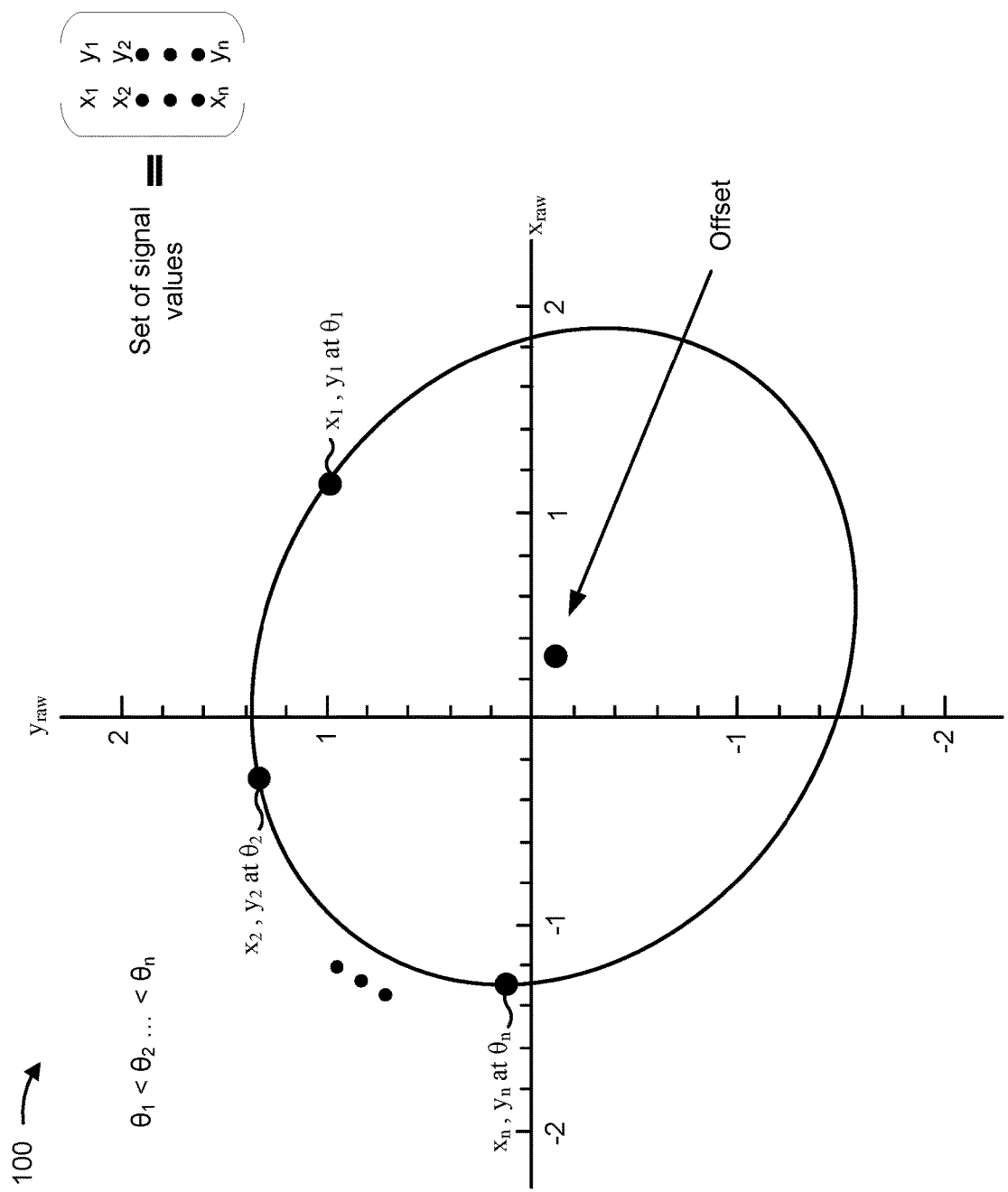

The following detailed description of example implementations refers to the accompanying drawings. The same reference numbers in different drawings may identify the same or similar elements.

A magnetic angle sensor (herein referred to as an angle sensor) may be designed to determine an angular position of a target object (e.g., a rotatable object) in a given application. For example, an angle sensor may be used in an electronic power steering application to determine an angular position of a steering column. In some applications, it may be necessary to ensure functional safety of the angle sensor.

In general, functional safety can be defined as an absence of unreasonable risk (e.g., to a system, to an environment, to people, and/or the like) due to hazards caused by malfunctioning behavior (e.g., a systematic failure, a random failure, or the like) of the angle sensor. In the automotive context, an Automotive Safety Integrity Level (ASIL) scheme is used to dictate functional safety requirements for an angle sensor. The ASIL scheme is a risk classification scheme defined by the International Organization for Standardization (ISO) 26262 standard (titled Functional Safety for Road Vehicles), which provides a standard for functional safety of electrical and/or electronic systems in production automobiles. An ASIL classification defines safety requirements necessary to be in compliance with the ISO 26262 standard. An ASIL is established by performing a risk analysis of a potential hazard by looking at severity, exposure, and controllability of a vehicle operating scenario. A safety goal for that hazard in turn guides the ASIL requirements. There are four ASILs identified by the standard: ASIL A, ASIL B, ASIL C, and ASIL D. ASIL D dictates the highest integrity requirements, while ASIL A dictates the lowest. A hazard with a risk that is low (and, therefore, does not require safety measures in accordance with ISO 26262) is identified as quality management (QM). In some cases, it is desirable or required that an angle sensor achieves a high ASIL. For example, it may be desirable or required that an angle sensor used in a given application achieves ASIL B, ASIL C, or ASIL D.

In order to reach a particular ASIL level, different parameters (e.g., failure-in-time rate, diagnostic coverage, single point faults metrics, latent fault metrics, and/or the like) may need to reach target values (e.g., based on the desired ASIL level). For an angle sensor, a functional safety goal may be to achieve a particular level of angle accuracy. For example, the functional safety goal may be to ensure that an angle of a magnetic field sensed by the angle sensor deviates by less than about 4.1 degrees from an actual angle of the magnetic field. Typically, a normalized signal is used to determine whether an angle sensor achieves a particular level of angle accuracy required by a particular ASIL. The normalized signal can be calculated from a set of calibration parameters that are determined based on raw data obtained by the angle sensor. For angle sensors having full rotations (e.g., 360° rotations), the set of calibration parameters can be computed based on maximum and minimum x-component values, maximum and minimum y-component values, and magnitudes of the x-component signal and the y-component signal at 45° and 135°. However, it may not be possible to accurately calculate the set of calibration parameters for angle sensors having less than full (360°) rotations (i.e., 120° rotation, 40° rotation, and/or the like), which may result in the particular angle accuracy of an angle sensor being inaccurately determined.

Some implementations described herein provide techniques for determining a set of calibration parameters for angle sensors having less than full rotations. For example, an angle sensor having less than a full rotation may be configured to sense a magnetic field present at the angle sensor and collect sensor data based on the magnetic field. The angle sensor may obtain, from the sensor data, a set of signal values indicating components of the magnetic field present at the angle sensor at a set of known calibration points. In some implementations, the angle sensor may generate a set of equations based on the set of calibration points. The angle sensor may perform an ellipse regression by solving a set of overdetermined equations corresponding to the generated set of equations. The angle sensor may calculate the set of calibration parameters based on performing the ellipse regression. In this way, a set of calibration parameters may be determined for angle sensors having less than full rotations, which may enable the angle accuracy of the angle sensor to be accurately determined.

FIGS. 1A-1E are diagrams of an example implementation 100 associated with an angle sensor calibration method for an angle sensor without full rotation. As shown in FIGS. 1A-1E, example implementation 100 includes an angle sensor 105, a magnet 110, and a rotatable object 115 configured to partially rotate (e.g., rotate less than 360 degrees) about an axis 120. These components of the angle sensor 105 are described in more detail below in connection with FIG. 4 and FIG. 5.

As shown in FIG. 1A, and by reference number 125, the angle sensor 105 may collect raw sensor data. In some implementations, the angle sensor 105 includes a plurality of sensing elements configured to generate phase shifted signals based on a magnitude and/or a direction of a magnetic field generated by the rotation of the magnet 110 about the axis 120.

As an example, the angle sensor 105 may include a first sensing element that generates a first signal (e.g., an x-component signal) based on an x-component value of the magnetic field generated by the magnet 110. In some implementations, the first signal may correspond to a cosine wave. The angle sensor 105 may include a second sensing element that generates a second signal (e.g., a y-component signal) based on a y-component value of the magnetic field generated by the magnet 110. In some implementations, the second signal may correspond to a sine wave. The first signal may be phase shifted by 90° relative to the second signal based on the first signal corresponding to a cosine wave and the second signal corresponding to a sine wave. The raw sensor data may include a set of signal values of the first signal (e.g., the x-component signal corresponding to the x-component of the magnetic field) and a set of signal values of the second signal (e.g., the y-component signal corresponding to the y-component of the magnetic field).

As shown by reference number 130, the angle sensor 105 may determine a set of calibration points based on the raw sensor data (e.g., based on the set of signal values of the first signal and/or the set of signal values of the second signal). In some implementations, the set of calibration points may be associated with a set of angular positions. The angle sensor 105 may determine a calibration point, of the set of calibration points, based on a value of the first signal (e.g., an x-component value) and a value of the second signal (e.g., a y-component value) at a first angular position. Similarly, the angle sensor 105 may determine a value of the first signal and a value of the second signal at each angular position, of the set of angular positions, based on the raw sensor data.

As shown in FIG. 1B, the set of signal values (e.g., the value of the first signal and the value of the second signal at each angular position) may correspond to a set of points on a portion of a perimeter of an ellipse. The perimeter of the ellipse may be defined based on a value of the first signal (e.g., the x-component of the magnetic field) and value of the second signal (e.g., the y-component of the magnetic field) generated if the rotatable object 115, and therefore, the magnet 110, were to rotate 360° about the axis 120. The portion of the perimeter of the ellipse may correspond to an actual rotation of the rotatable object 115 (e.g., less than 360° about axis 120).

As further shown in FIG. 1B, a center of the ellipse may be offset from the origin of a graph on which the set of signal values are plotted. The center of the ellipse may be offset from the origin and/or the set of signal values may correspond to a set of points on a portion of a perimeter of an ellipse (e.g., rather than a circle formed by plotting values of a cosine wave and a sine wave corresponding to the first signal and the second signal, respectively) based on one or more factors. For example, the one or more factors may include a vibration sensed by one sensor element of the angle sensor 105 that is not accounted for by the angle sensor 105 and/or not sensed by another sensor element of the angle sensor 105, an error in calibrating the angle sensor 105, an error in a placement of the angle sensor 105 and/or a sensing element of the angle sensor 105, and/or a lack of accounting for an offset of the sensor elements (e.g., from a threshold crossing level of an analog-to-digital converter (ADC) signal (described below with respect to FIG. 5) from the sensor elements), among other examples.

Figure 1C:
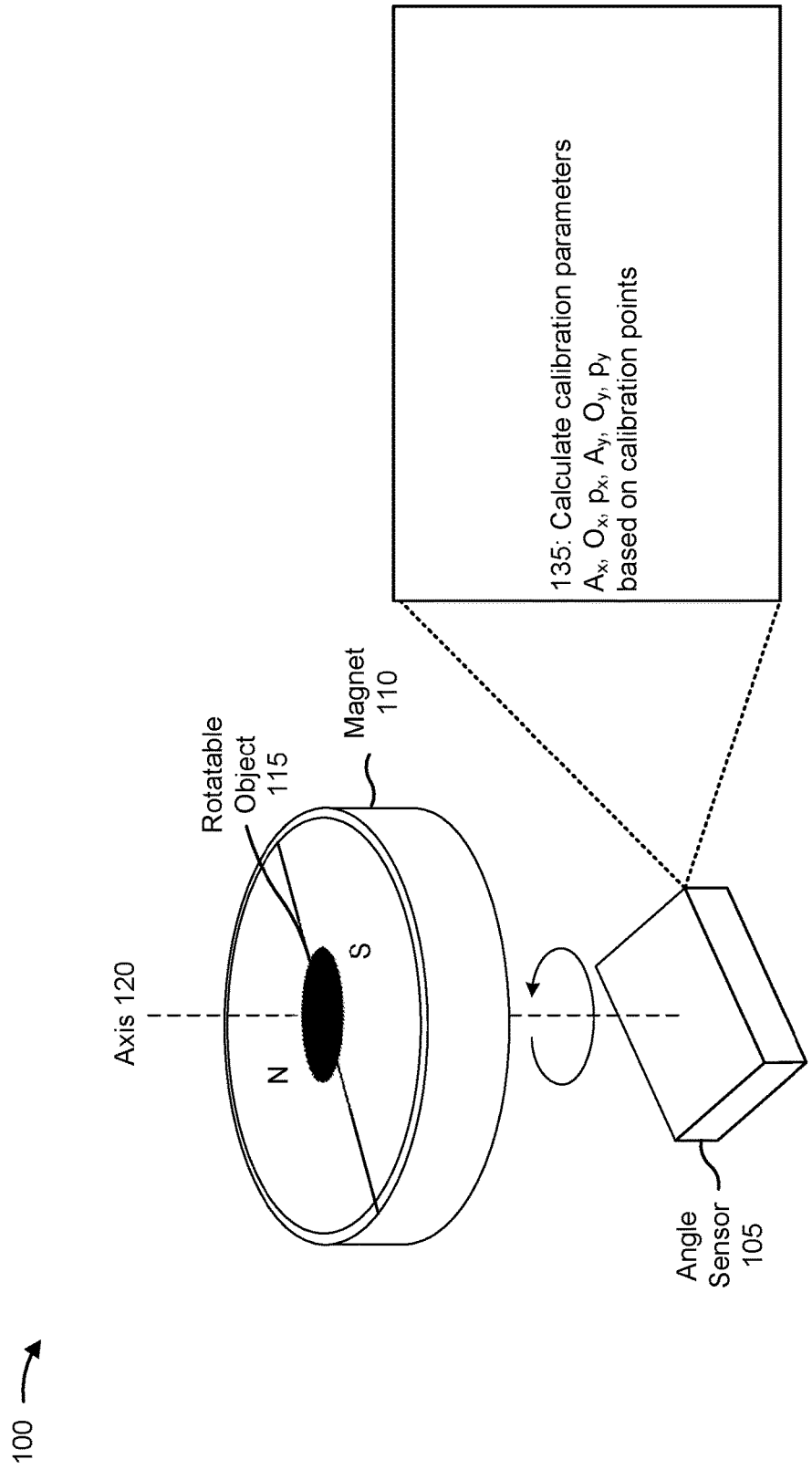

As shown in FIG. 1C, and by reference number 135, the angle sensor 105 may calculate a set of calibration parameters based on the set of calibration points. In some implementations, the set of calibration parameters may include an amplitude ($A_x$) of the first signal (e.g., an amplitude of the x-component of the magnetic field), an amplitude ($A_y$) of the second signal (e.g., an amplitude of the y-component of the magnetic field), an offset ($O_x$) of the first signal, an offset ($O_y$) of the second signal, and/or a non-orthogonality ($\Phi_p$) of the first signal and the second signal. The set of calibration parameters may be utilized to normalize the raw sensor data (e.g., to obtain normalized sensor data). The normalized sensor data may account for the one or more factors described above. For example, the normalized sensor data may correspond to a circle (shown in FIG. 2B) formed by plotting normalized values of the first signal (e.g., a cosine wave) and normalized values of the second signal (e.g., a sine wave).

In some implementations, the angle sensor 105 may calculate the set of calibration parameters as described below with respect to FIGS. 2A-2F.

Figure 1D:
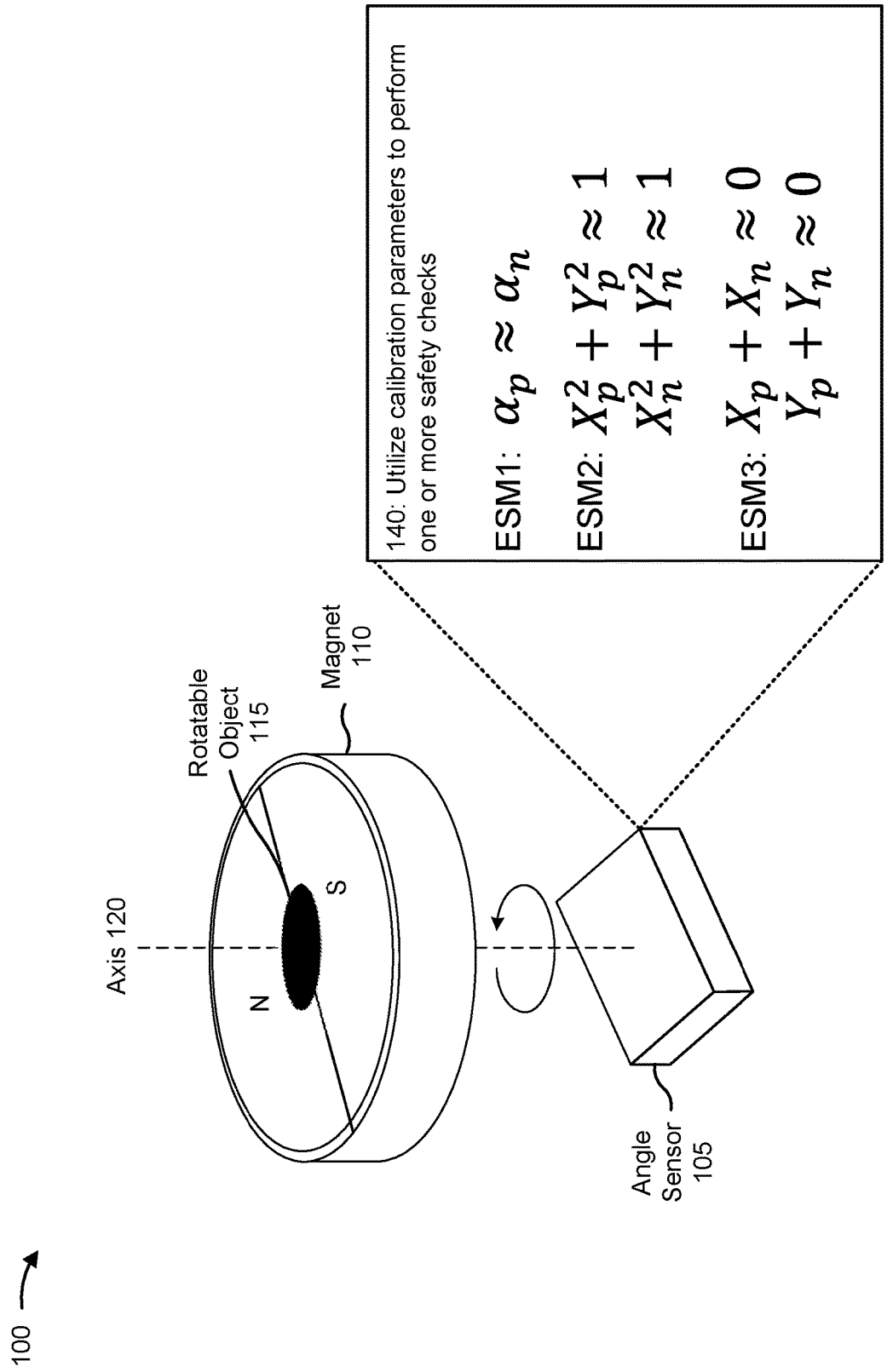

As shown in FIG. 1D, and by reference number 140, the angle sensor 105 may utilize the set of calibration parameters to perform one or more safety checks. In some implementations, the one or more safety checks include a set of easy safety mechanisms (ESMs). For example, as shown in FIG. 1D, the one or more safety checks may include a first ESM (ESM1), a second ESM (ESM2), and/or a third ESM (ESM3).

The first ESM may be performed to determine whether a difference ($\alpha_p$) between a first signal and a second signal of a first sensing element of the angle sensor 105 is substantially the same (e.g., within a threshold amount determined based on a standard) as a difference ($\alpha_n$) between a first signal and a second signal of a second sensing element of the angle sensor 105 (e.g., whether $\alpha_p$ is approximately equal to $\alpha_n$ ($\alpha_p \approx \alpha_n$)).

In some implementations, the second ESM may be performed to determine whether a sum of a square of a value of a first signal (e.g., a value of an x-component) generated by a first sensing element of the angle sensor 105 and a square of a value of a second signal (e.g., a value of a y-component) generated by the first sensing element is approximately equal to 1. Alternatively, and/or additionally, the second ESM may be performed to determine whether a sum of a square of a value of a first signal (e.g., a value of an x-component) generated by a second sensing element of the angle sensor 105 and a square of a value of a second signal (e.g., a value of a y-component) generated by the second sensing element is approximately equal to 1. In some implementations, the angle sensor 105 may perform the second ESM based on one or more of the following equations:

$$X_p^2 + Y_p^2 \approx 1, \text{ or}$$

$$X_n^2 + Y_n^2 \approx 1.$$

In some implementations, the third ESM may be performed to determine whether a sum of a value of a first signal (e.g., a value of an x-component) generated by a first sensing element of the angle sensor 105 and a value of a first signal (e.g., a value of an x-component) generated by a second sensing element of the angle sensor 105 is approximately equal to 0. Alternatively, and/or additionally, the third ESM may be performed to determine whether a sum of a value of a second signal (e.g., a value of a y-component) generated by the first sensing element and a value of a second signal (e.g., a value of a y-component) generated by the second sensing element is approximately equal to 0. In some implementations, the angle sensor 105 may perform the third ESM based on one or more of the following equations:

$$X_p + Y_p \approx 0, \text{ or}$$

$$X_n + Y_n \approx 0.$$

Figure 1E:
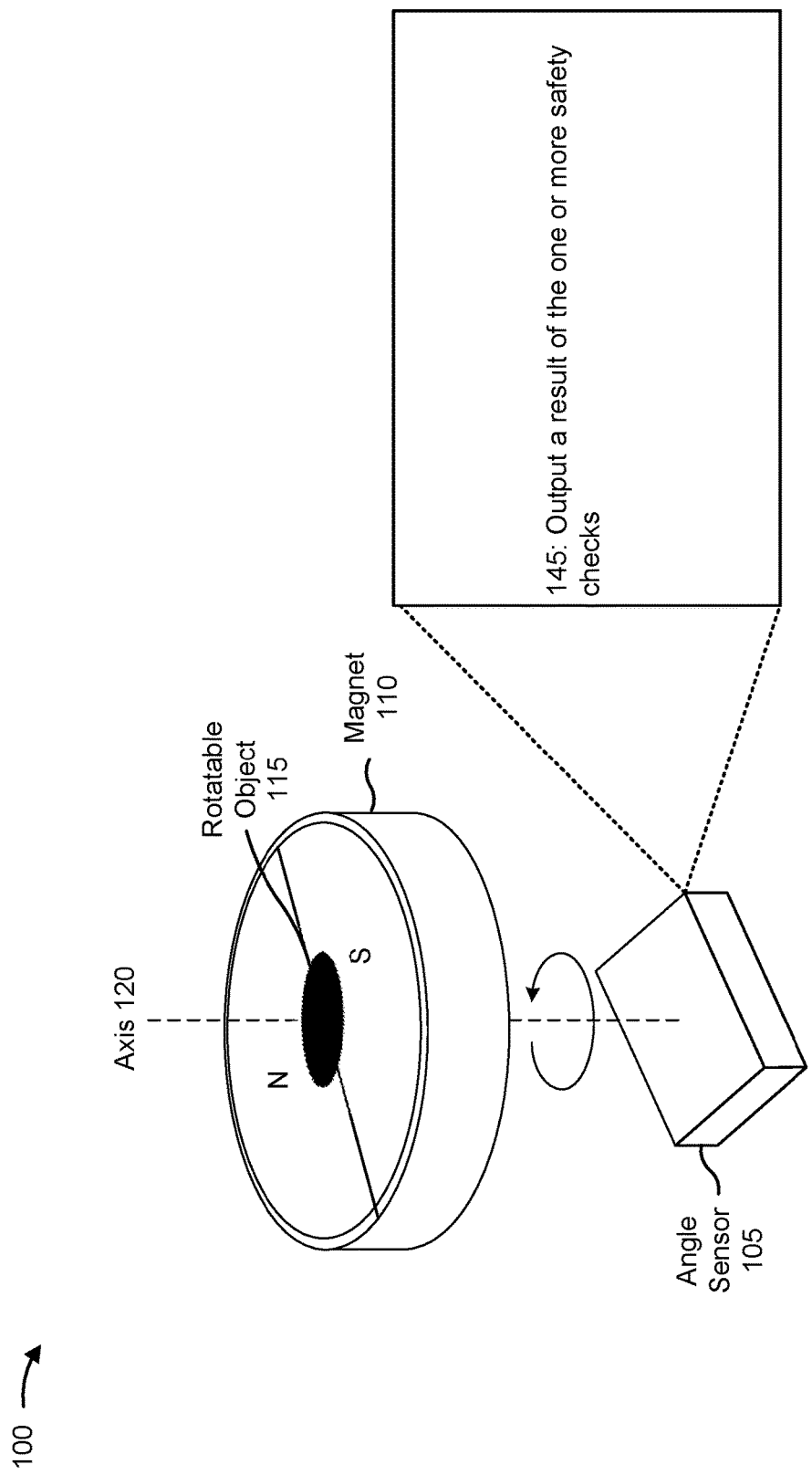

As shown in FIG. 1E, and by reference number 145, the angle sensor 105 may output a result of the one or more safety checks. In some implementations, the angle sensor 105 may output a result of performing the first ESM, the second ESM, and/or the third ESM. In some implementations, the angle sensor 105 may output a result of performing the first ESM that indicates a value corresponding to a difference between $\alpha_p$ and $\alpha_n$ and/or an indication of whether the difference between $\alpha_p$ and $\alpha_n$ satisfies (e.g., is less than) a threshold, among other examples.

In some implementations, the angle sensor 105 may output a result of performing the second ESM that indicates the sum of the square of the value of the first signal generated by the first sensing element of the angle sensor 105 and the square of the value of the second signal generated by the first sensing element, a difference between the value 1 and the sum of the square of the value of the first signal generated by the first sensing element and the square of the value of the second signal generated by the first sensing element, and/or whether the difference satisfies (e.g., is less than) a threshold, among other examples. Alternatively, and/or additionally, the result of performing the second ESM may indicate the sum of the square of the value of the second signal generated by the second sensing element and the square of the value of the second signal generated by the second sensing element, a difference between the value 1 and the sum of the square of the value of the first signal generated by the second sensing element and the square of the value of the second signal generated by the second sensing element, and/or whether the difference satisfies (e.g., is less than) a threshold, among other examples.

In some implementations, the angle sensor 105 may output a result of performing the third ESM that indicates the sum of the value of the first signal generated by the first sensing element of the angle sensor 105 and the value of the first signal generated by the second sensing element of the angle sensor 105, a difference between the value 1 and the sum of the value of the first signal generated by the first sensing element and the value of the first signal generated by the second sensing element, and/or whether the difference satisfies (e.g., is less than) a threshold, among other examples. Alternatively, and/or additionally, the result of performing the third ESM may indicate the sum of the value of the second signal generated by the first sensing element and the value of the second signal generated by the second sensing element, a difference between the value 0 and the sum of the value of the second signal generated by the first sensing element and the value of the second signal generated by the first sensing element, and/or whether the difference satisfies (e.g., is less than) a threshold, among other examples.

As indicated above, FIGS. 1A-1E are provided as an example. Other examples may differ from what is described with regard to FIGS. 1A-1E. The number and arrangement of devices shown in FIGS. 1A-1E are provided as an example. In practice, there may be additional devices, fewer devices, different devices, or differently arranged devices than those shown in FIGS. 1A-1E. Furthermore, two or more devices shown in FIGS. 1A-1E may be implemented within a single device, or a single device shown in FIGS. 1A-1E may be implemented as multiple, distributed devices. Additionally, or alternatively, a set of devices (e.g., one or more devices) shown in FIGS. 1A-1E may perform one or more functions described as being performed by another set of devices shown in FIGS. 1A-1E.

FIGS. 2A-2F are diagrams of an example implementation 200 associated with calculating a set of calibration parameters of the angle sensor calibration method for safety measure without full rotation. As shown in FIGS. 2A-2F, example implementation 200 includes an angle sensor 105, a magnet 110, and a rotatable object 115 configured to partially rotate (e.g., rotate less than 360 degrees) about an axis 120. These devices are described in more detail below in connection with FIG. 4 and FIG. 5.

Figure 2A:
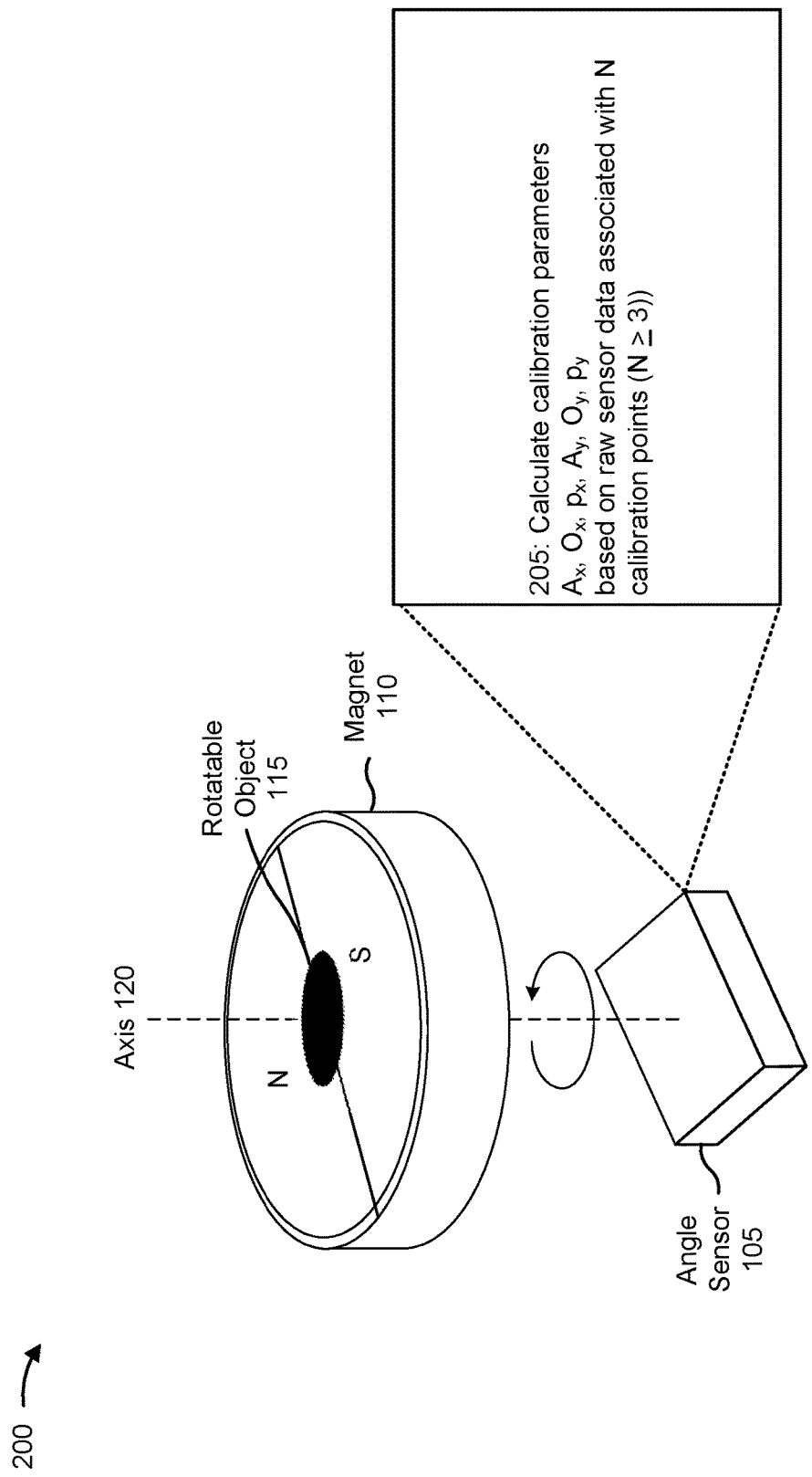
FIGS. 2A-2F are diagrams of an example of calculating a set of calibration parameters of the angle sensor calibration method for safety measure without full rotation of FIGS. 1A-1E.

The angle sensor 105 may obtain raw sensor data in a manner similar to that described above. As shown in FIG. 2A, and by reference number 205, the angle sensor 105 may calculate a set of calibration parameters based on raw sensor data associated with N calibration points (where N is an integer value greater than, or equal to, three). In some implementations, as described herein with respect to FIGS. 2A-2F, the angle sensor 105 may calculate a set of calibration parameters based on raw sensor data associated with five calibration points.

In some implementations, the set of calibration parameters may correspond to the calibration parameters described above. For example, the calibration parameters may include an amplitude ($A_x$) of a first signal (e.g., an amplitude of the x-component of the magnetic field) generated by a sensing element of the angle sensor 105, an amplitude ($A_y$) of a second signal (e.g., an amplitude of the y-component of the magnetic field) generated by the sensing element, an offset ($O_x$) of the first signal, an offset ($O_y$) of the second signal, and/or a non-orthogonality ($\Phi_p$) of the first signal and the second signal.

Figure 2B:
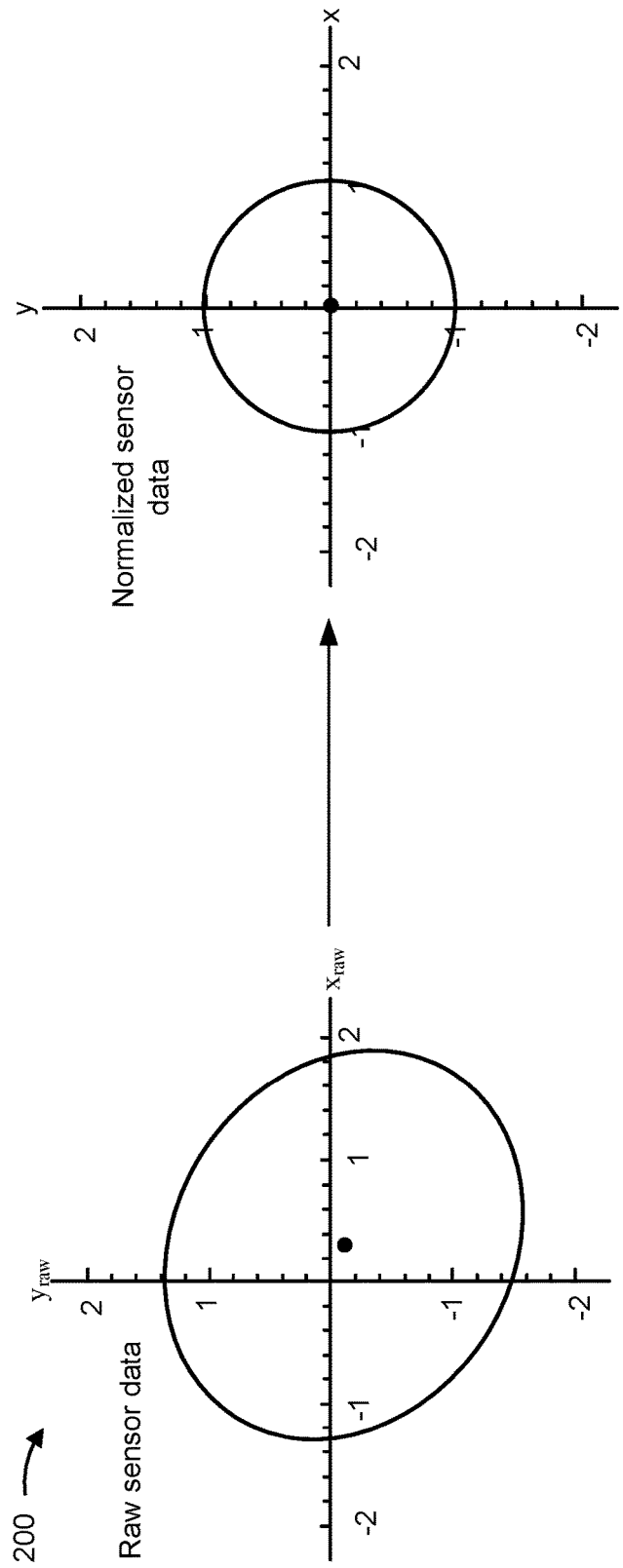

As shown in FIG. 2B, and by reference number 210, the angle sensor 105 may represent the raw sensor data associated with the N calibration points as a set of equations. The set of equations may represent one or more differences in the raw sensor data relative to normalized sensor data (e.g., sensor data not affected by one or more factors, as described above). In some implementations, the raw sensor data may be represented by the following equations:

$$X_{raw} = A_x \cos(\theta + p_x) + O_x$$

$$Y_{raw} = A_y \sin(\theta + p_y) + O_y,$$

where $p_y - p_x = \Phi_p$, $\Phi_p$ is the non-orthogonality of the first signal and the second signal, $A_x$ is the amplitude of the first signal, $A_y$ is the amplitude of the second signal, $O_x$ is the offset of the first signal, and $O_y$ is the offset of the second signal.

Figure 2C:
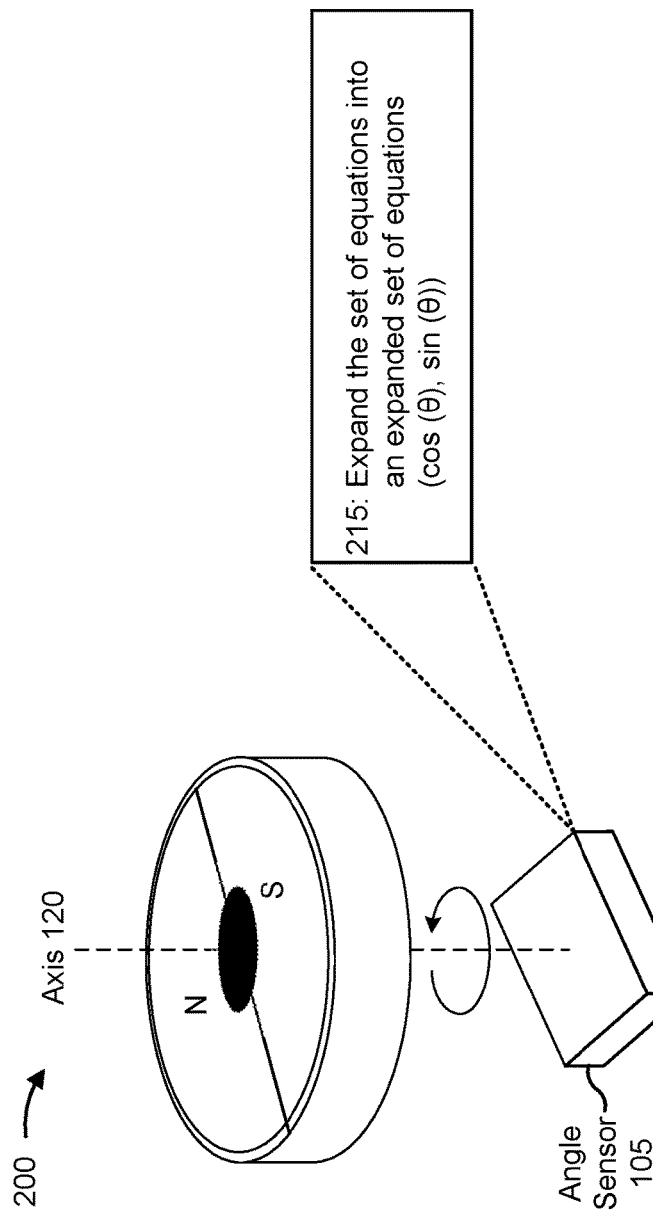

As shown in FIG. 2C, and by reference number 215, the angle sensor 105 may expand the set of equations corresponding to the raw sensor data associated with the set of calibration points into an expanded set of equations. In some implementations, as shown in FIG. 2C, the raw sensor data may expand the set of equations based on the following trigonometric addition formulas:

$$\cos(A+B) = \cos(A)\cos(B) - \sin(A)\sin(B)$$

$$\sin(A+B) = \sin(A)\cos(B) + \cos(A)\sin(B).$$

Utilizing the equations described above, the expanded set of equations may correspond to the following equations:

$$x = A_x \cos(\theta + p_x) + O_x = A_x \cos(\theta)\cos(p_x) - A_x \sin(\theta)\sin(p_x) + O_x$$

$$y = A_y \sin(\theta + p_y) + O_y = A_y \cos(\theta)\sin(p_y) + A_y \sin(\theta)\cos(p_y) + O_y$$

Figure 2D:
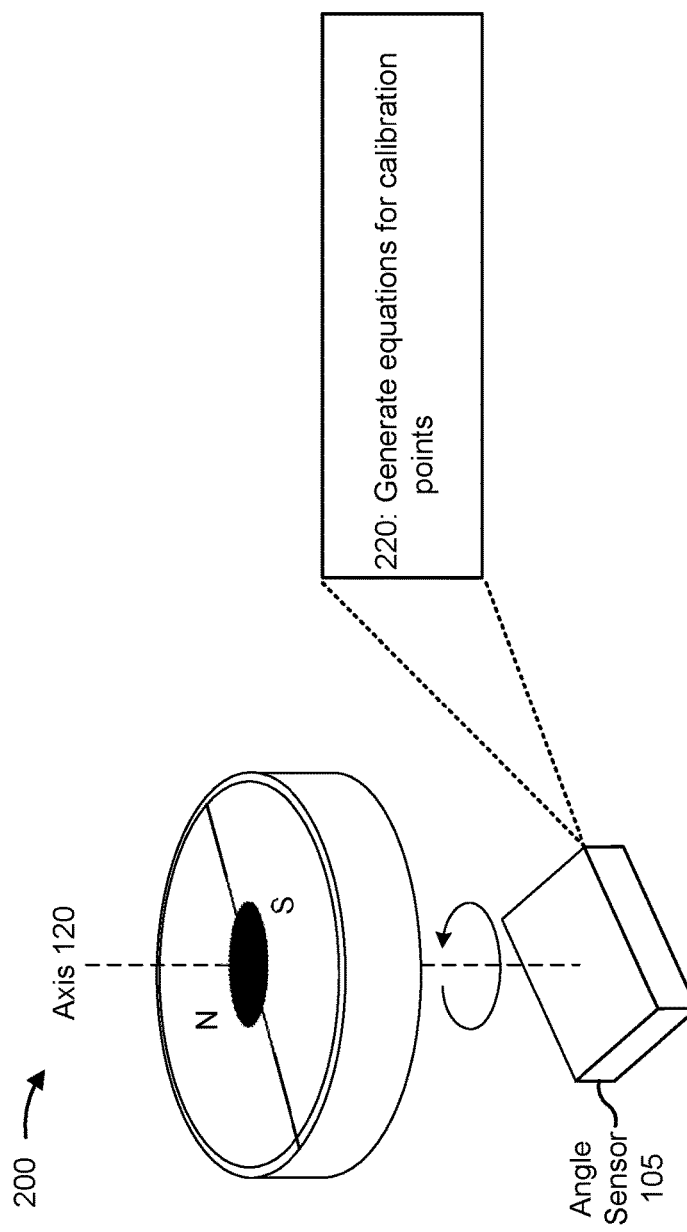

As shown in FIG. 2D, and by reference number 220, the angle sensor 105 may generate equations for the set of calibration points based on the expanded set of equations. For example, for a set of five calibration points, and based on the expanded set of equations described above, the angle sensor 105 may generate a respective set of equations for each of the five calibration points. For example, for a first calibration point, of the set of calibration points, the angle sensor 105 may generate a first equation ($x_1$) associated with a value of the first signal at an angular position corresponding to the first calibration point and a second equation ($y_1$) associated with a value of the second signal at the angular position corresponding to the first calibration point. As shown in FIG. 2D, for the first calibration point, the angle sensor 105 may generate the following equations:

$$x_1 = A_x \cos(\theta_1)\cos(p_x) - A_x \sin(\theta_1)\sin(p_x) + O_x$$

$$y_1 = A_y \cos(\theta_1)\sin(p_y) + A_y \sin(\theta_1)\cos(p_y) + O_y.$$

In some implementations, the angle sensor 105 may generate a set of equations for each calibration point, of the set of calibration points, in a similar manner.

Figure 2E:
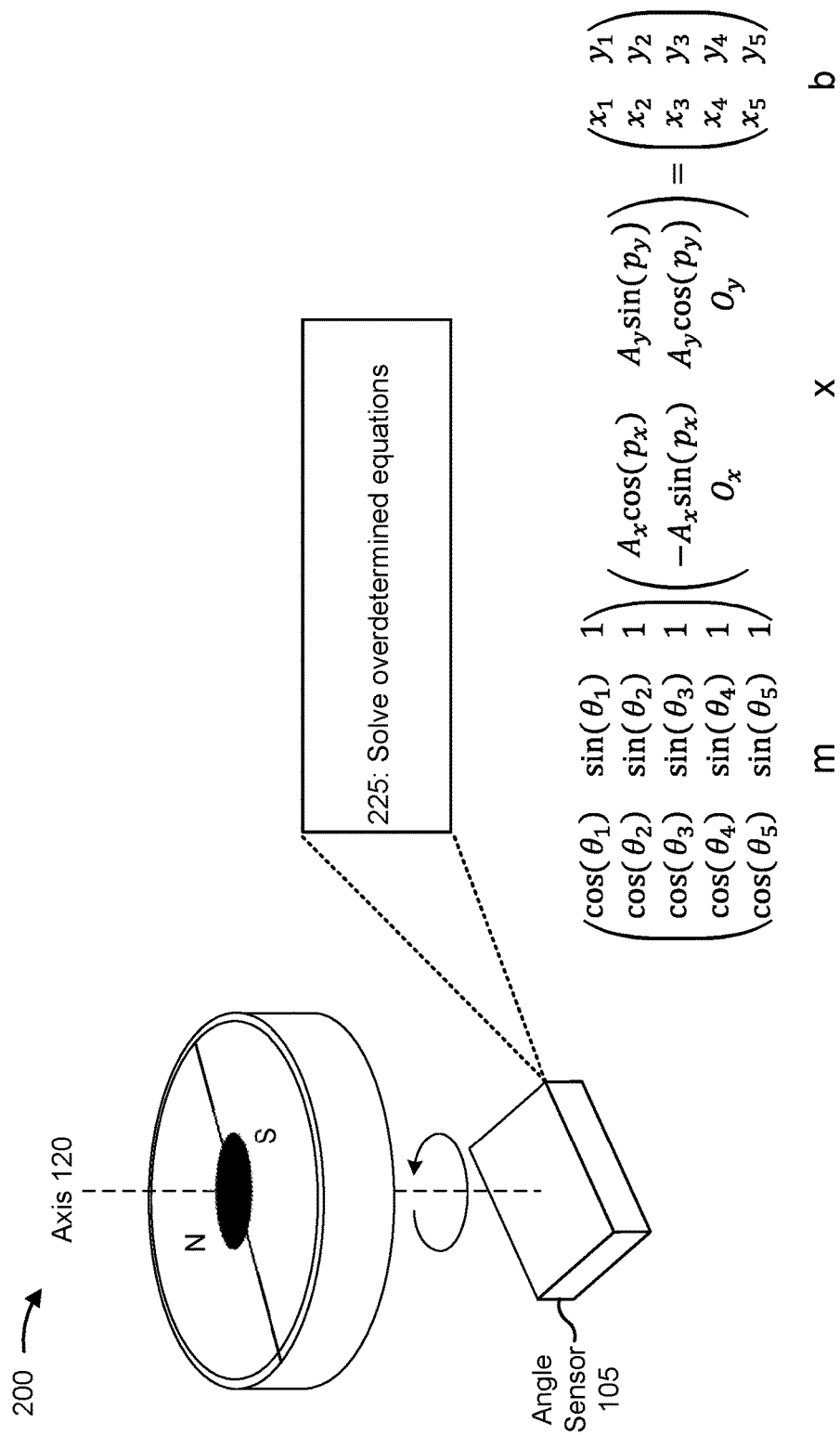

As shown in FIG. 2E, and by reference number 225, the angle sensor 105 may solve for the set of calibration parameters by solving a set of overdetermined equations corresponding to the equations generated for the set of calibration points. In some implementations, the set of equations generated for the set of calibration points may correspond to a linear system of equations. The linear system of equations may be represented by the following equation:

$$mx = b,$$

where m is a matrix with N (e.g., 5) rows and Z (e.g., 3) columns (where N>Z).

Figure 2F:
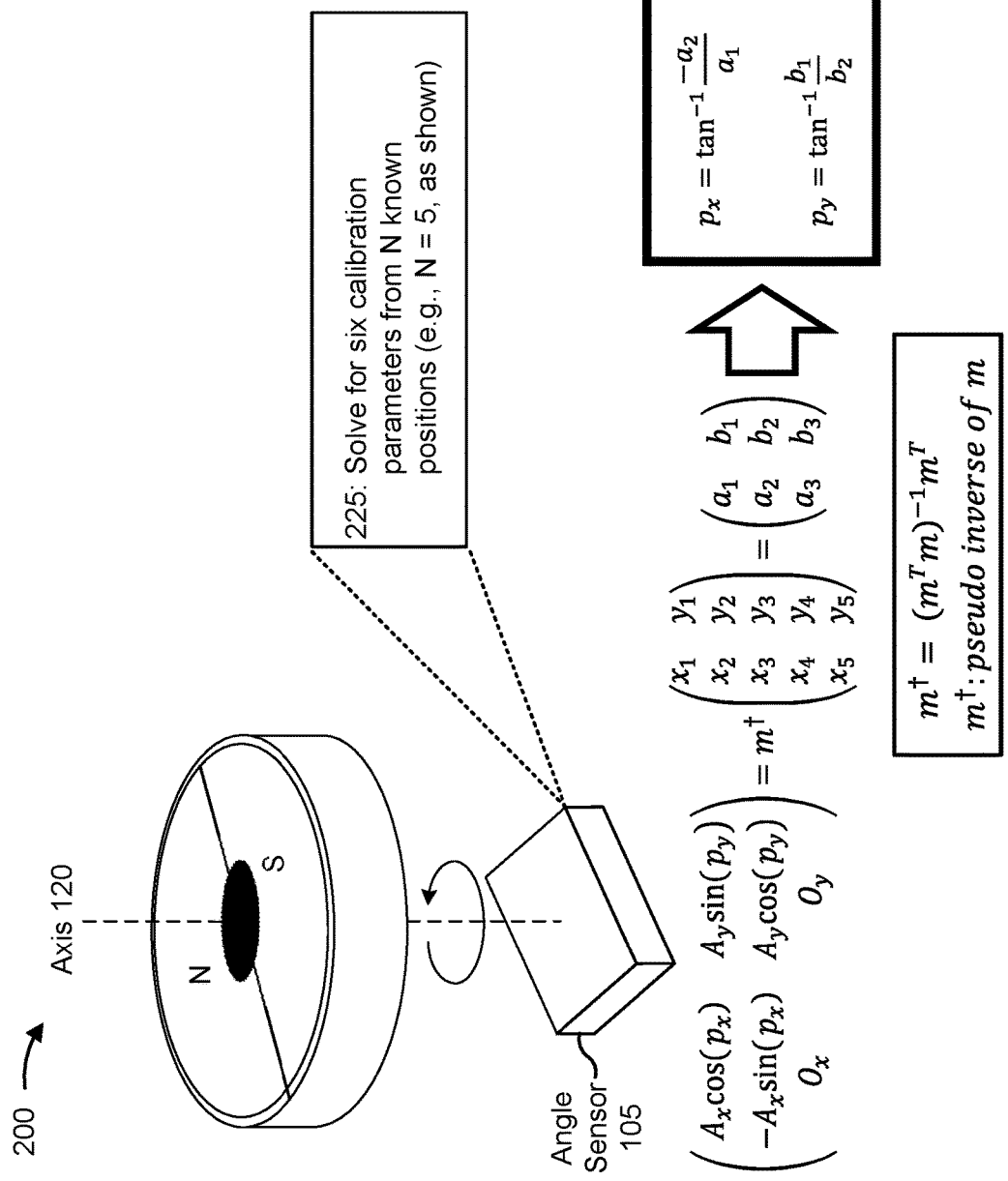

As shown in FIG. 2F, and by reference number 230, the angle sensor 105 may solve for the six calibration parameters, of the set of calibration parameters, from N (e.g., 5, as shown in FIG. 2F) known positions (e.g., the set of N calibration points). In some implementations, the angle sensor 105 may multiple both sides of the equation by the pseudo inverse of the matrix m, which may result in x being equal to the matrix b multiplied by the pseudo inverse of the matrix m. The angle sensor 105 may then solve for the set of calibration parameters, as shown in FIG. 2F.

As indicated above, FIGS. 2A-2F are provided as an example. Other examples may differ from what is described with regard to FIGS. 2A-2F. The number and arrangement of devices shown in FIGS. 2A-2F are provided as an example. In practice, there may be additional devices, fewer devices, different devices, or differently arranged devices than those shown in FIGS. 2A-2F. Furthermore, two or more devices shown in FIGS. 2A-2F may be implemented within a single device, or a single device shown in FIGS. 2A-2F may be implemented as multiple, distributed devices. Additionally, or alternatively, a set of devices (e.g., one or more devices) shown in FIGS. 2A-2F may perform one or more functions described as being performed by another set of devices shown in FIGS. 2A-2F.

Figure 3A:
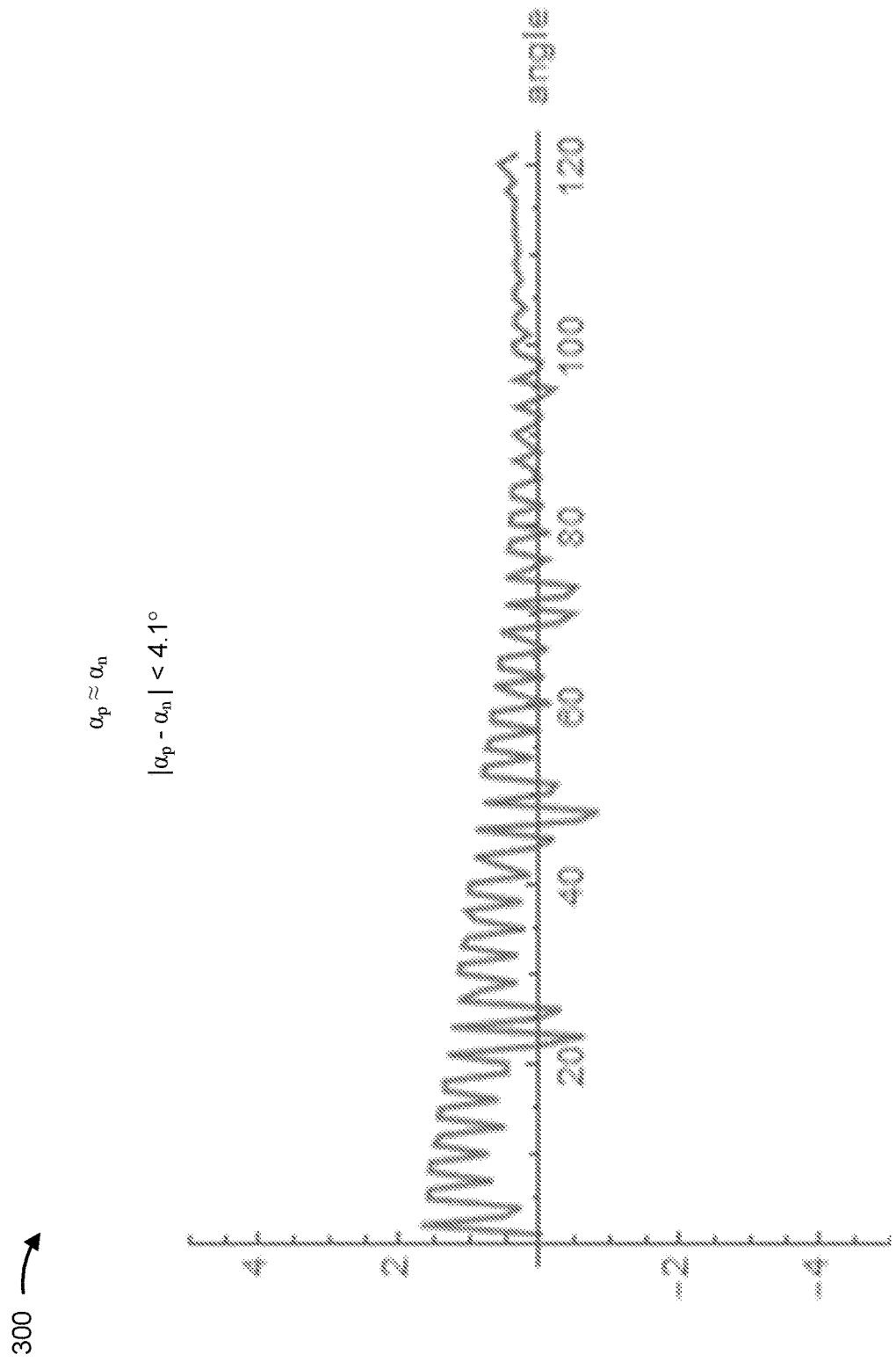
FIGS. 3A-3E are diagrams of example calculations of a set of easy safety measures (ESMs) based on the angle sensor calibration method for safety measure without full rotation of FIGS. 1A-1E and 2A-2F.

FIGS. 3A-3E are diagrams of example implementations of verifying the set of calibration parameters determined based on the processes described in connection with FIGS. 1A-1E and 2A-2F. As shown in FIG. 3A, an example implementation 300 is associated with the first ESM. In particular, FIG. 3A is a graph depicting an absolute value of difference ($\alpha_p$) between a first signal and a second signal of a first sensing element of the angle sensor 105 and a difference ($\alpha_n$) between a first signal and a second signal of a second sensing element of the angle sensor 105 as the magnet 110 rotates about the axis 120. As shown, an absolute value of a value corresponding to a difference between $\alpha_p$ and $\alpha_n$ (e.g., $|\alpha_p - \alpha_n|$) is less than 4.1° for each angular position of the magnet 110 as the magnet 110 rotates about the axis 120.

Figure 3B:
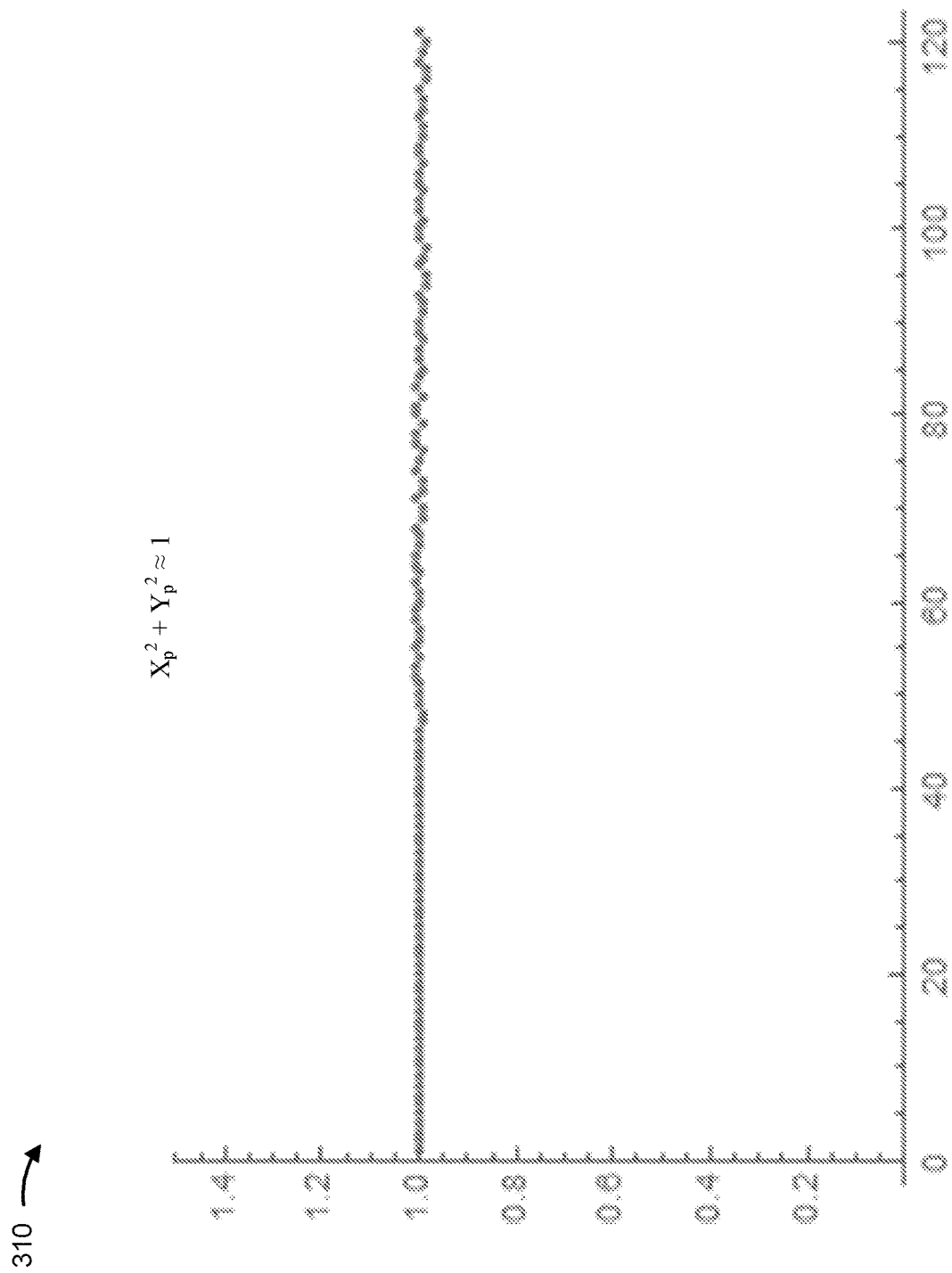

As shown in FIG. 3B, an example implementation 310 is associated with the second ESM. In particular, FIG. 3B is a graph depicting a value of a sum of a square of a value of a first signal (e.g., a value of an x-component) generated by a first sensing element of the angle sensor 105 and a square of a value of a second signal (e.g., a value of a y-component) generated by the first sensing element as the magnet 110 rotates about the axis 120. As shown, the value is approximately 1 for each angular position of the magnet 110 as the magnet 110 rotates about the axis 120.

Figure 3C:
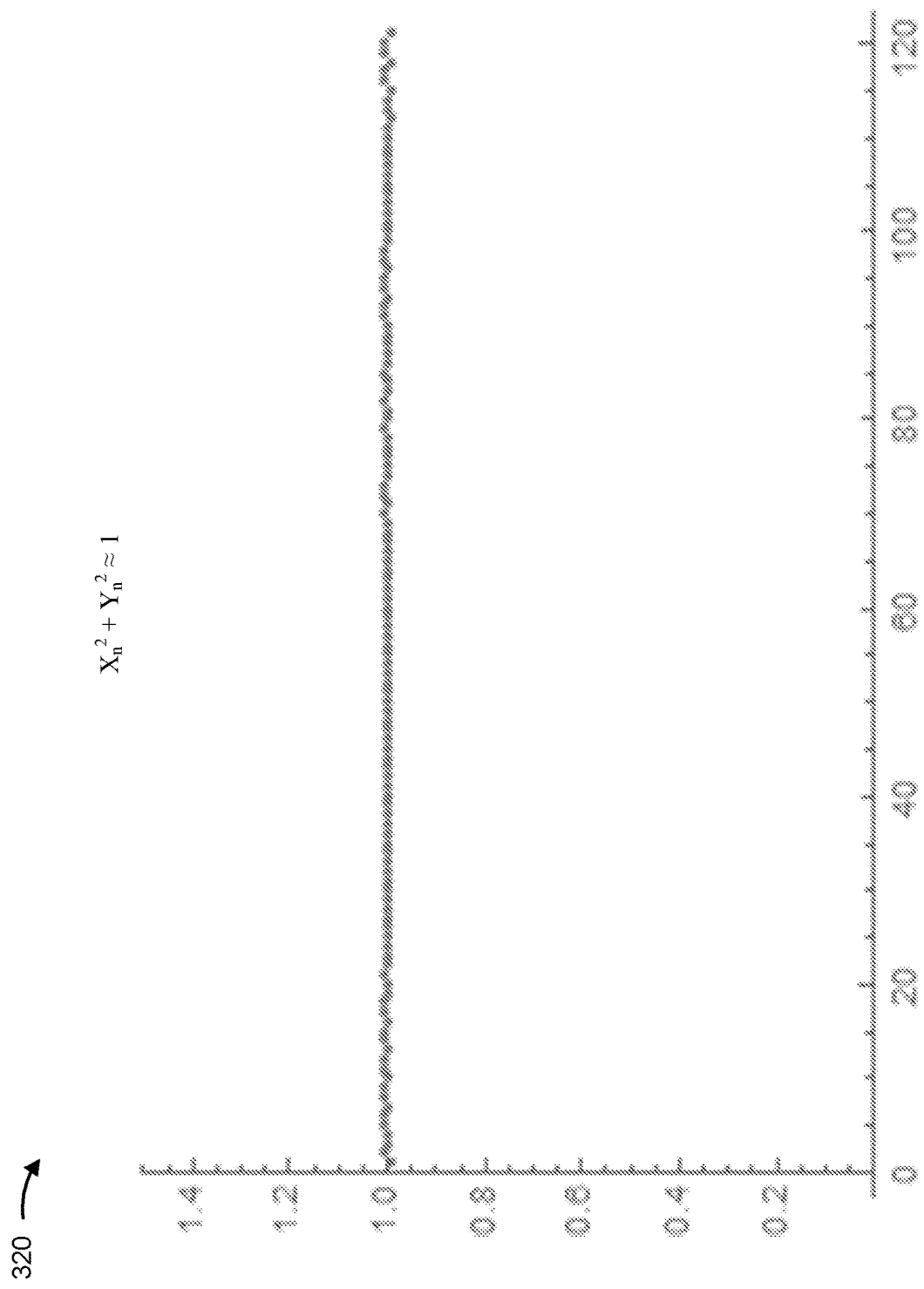

As shown in FIG. 3C, example implementation 320 is associated with the second ESM. In particular, FIG. 3C is a graph depicting a value of a sum of a square of a value of a first signal (e.g., a value of an x-component) generated by a second sensing element of the angle sensor 105 and a square of a value of a second signal (e.g., a value of a y-component) generated by the second sensing element as the magnet 110 rotates about the axis 120. As shown, the value is approximately 1 for each angular position of the magnet 110 as the magnet 110 rotates about the axis 120.

Figure 3D:

As shown in FIG. 3D, example implementation 330 is associated with the third ESM. In particular, FIG. 3D is a graph depicting a value of a sum of a value of a first signal (e.g., a value of an x-component) generated by a first sensing element of the angle sensor 105 and a value of a first signal (e.g., a value of an x-component) generated by a second sensing element of the angle sensor 105 as the magnet 110 rotates about the axis 120. As shown, the value is approximately 0 for each angular position of the magnet 110 as the magnet 110 rotates about the axis 120.

Figure 3E:
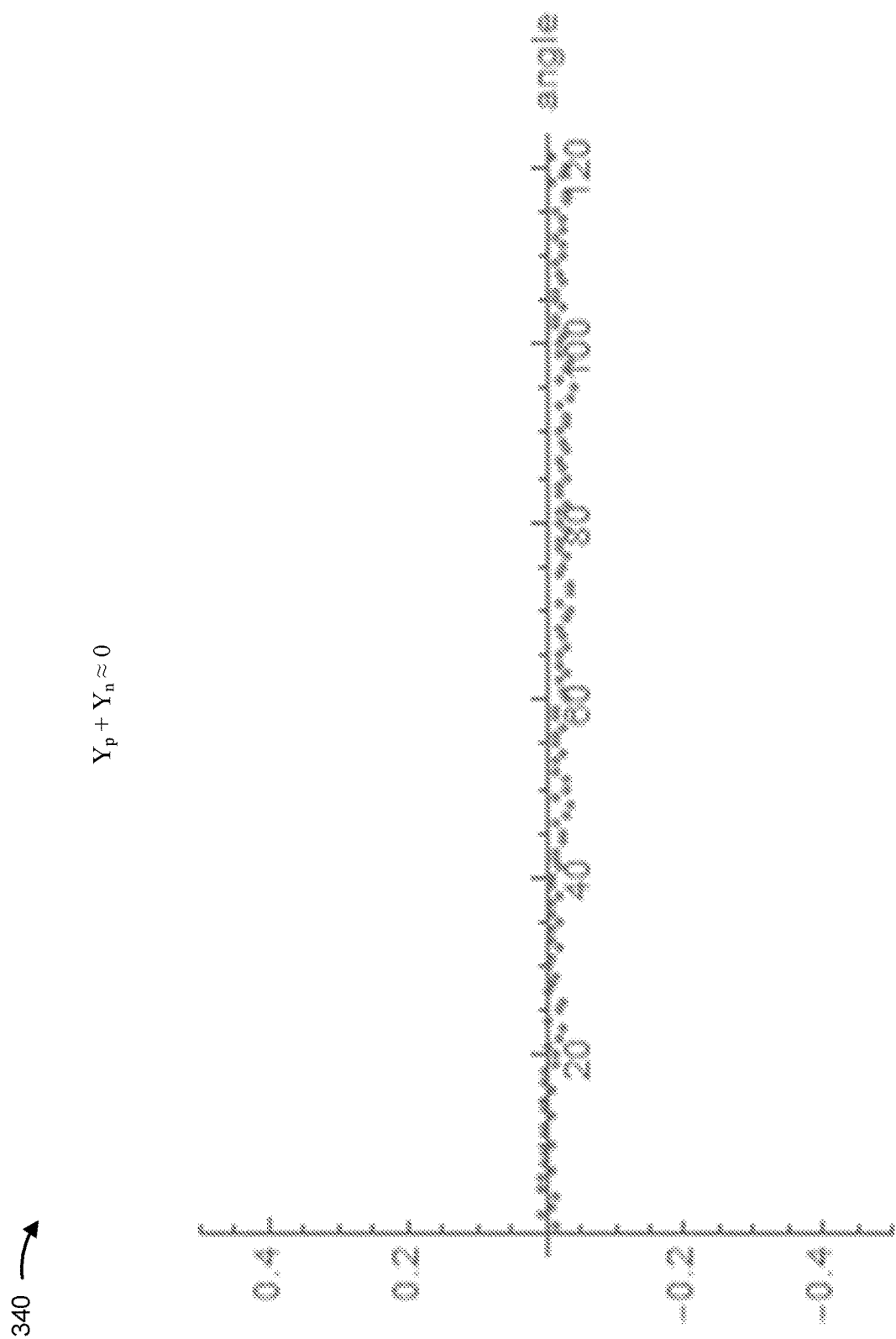

As shown in FIG. 3E, example implementation 340 is associated with the third ESM. In particular, FIG. 3E is a graph depicting a value of a sum of a value of a second signal (e.g., a value of a y-component) generated by a first sensing element of the angle sensor 105 and a value of a second signal (e.g., a value of a y-component) generated by a second sensing element of the angle sensor 105 as the magnet 110 rotates about the axis 120. As shown, the value is approximately 0 for each angular position of the magnet 110 as the magnet 110 rotates about the axis 120.

As indicated above, FIGS. 3A-3E are provided as an example. Other examples may differ from what is described with regard to FIGS. 3A-3E. The number and arrangement of devices shown in FIGS. 3A-3E are provided as an example. In practice, there may be additional devices, fewer devices, different devices, or differently arranged devices than those shown in FIGS. 3A-3E. Furthermore, two or more devices shown in FIGS. 3A-3E may be implemented within a single device, or a single device shown in FIGS. 3A-3E may be implemented as multiple, distributed devices. Additionally, or alternatively, a set of devices (e.g., one or more devices) shown in FIGS. 3A-3E may perform one or more functions described as being performed by another set of devices shown in FIGS. 3A-3E.

Figure 4:
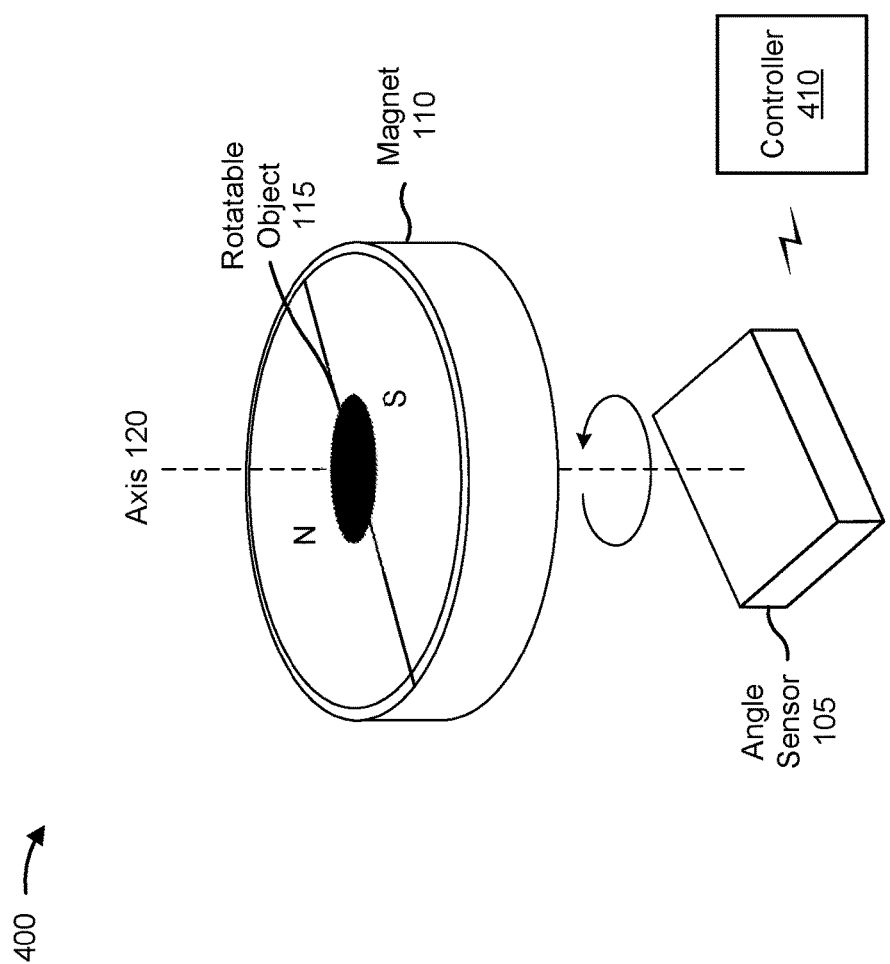
FIG. 4 is a diagram of an example environment in which systems and/or methods, described herein, may be implemented.

FIG. 4 is a diagram of an example environment 400 in which apparatuses described herein may be implemented. As shown in FIG. 2, environment 200 may include an angle sensor 105, a magnet 110 that may rotate about an axis 120, and a controller 410.

Magnet 110 includes one or more magnets positioned to rotate about axis 120 (e.g., an imaginary line). In some implementations, magnet 110 may be connected (e.g., mechanically) to a rotatable object (not shown) such that a rotation angle of magnet 110 corresponds to a rotation angle of the rotatable object (e.g., when there exists a non-slip relation between an end face of the rotatable object and magnet 110).

In the example environment 400 shown in FIG. 4, magnet 110 comprises a first half forming a north pole (N) and a second half forming a south pole (S), so that magnet 110 comprises one pole pair. In some implementations, magnet 110 may, without limitation, comprise more than one pole pair. In some implementations, magnet 110 may include a disk magnet that is positioned concentrically about axis 120 that passes through the center of magnet 110, as shown in FIG. 4. While magnet 110 is shown as circular in FIG. 4, magnet 110 may be another shape, such as a square, a rectangular, an ellipse, or the like. For example, magnet 110 may be of an elliptical shape in an instance where an angle between a plane corresponding to a surface of magnet 110 and axis 120 deviates from a substantially perpendicular relation. The plane may include a plane symmetrically cutting through magnet 110 and including a magnet center of magnet 110. In most practical cases, the plane may be substantially perpendicular to axis 120. As another example, magnet 110 may include a ring magnet that is positioned to rotate about axis 120 (along with the rotatable object 115). A ring magnet may be of interest for an arrangement of magnet 110 at an end of the rotatable object 115.

In some implementations, magnet 110 may include two alternating poles on two portions of magnet 110 (e.g., a north pole on a first half of magnet 110, and a south pole on a second half of magnet 110). Additionally, or alternatively, magnet 110 may include a dipole magnet (e.g., a dipole bar magnet, a circular dipole magnet, an elliptical dipole magnet, etc.), a permanent magnet, an electromagnet, a magnetic tape, or the like. Magnet 110 may comprise a ferromagnetic material (e.g., Hard Ferrite), and may produce a magnetic field. Magnet 110 may further comprise a rare earth magnet which may be of advantage due to an intrinsically high magnetic field strength of rare earth magnets. As described above, in some implementations, magnet 110 may be attached to or coupled with a rotatable object for which a rotation angle may be determined (e.g., by angle sensor 105, by controller 410) based on a rotation angle of magnet 110.

Angle sensor 105 includes one or more sensing devices for detecting components of a magnetic field for use in determining an angle of rotation (e.g., of magnet 110 and/or of the rotatable object 120 to which magnet 110 is connected). For example, angle sensor 105 may include one or more circuits (e.g., one or more integrated circuits). In some implementations, angle sensor 105 may be placed at a position relative to magnet 110 such that angle sensor 105 may detect components of the magnetic field produced by magnet 110. In some implementations, angle sensor 105 may include an integrated circuit that includes an integrated controller 410 (e.g., such that an output of angle sensor 105 may include information that describes a rotation angle of magnet 110 and/or the rotatable object).

In some implementations, angle sensor 105 may include a group of sensing elements configured to sense amplitudes of components of the magnetic field, produced by magnet 110, that are present at angle sensor 105. Additionally, or alternatively, angle sensor 105 may include a temperature sensing element that allows angle sensor 105 to determine a temperature at or near angle sensor 105. Additional details regarding angle sensor 105 are described below with regard to FIG. 5.

Controller 410 includes one or more circuits associated with determining a rotation angle of magnet 110, and providing information associated with the rotation angle of magnet 110 and hence the rotation angle of the rotatable object to which magnet 110 is connected. For example, controller 410 may include one or more circuits (e.g., an integrated circuit, a control circuit, a feedback circuit, and/or the like). Controller 410 may receive input signals from one or more sensors (such as one or more angle sensors 105), may process the input signals (e.g., using an analog signal processor, a digital signal processor, etc.) to generate an output signal, and may provide the output signal to one or more other devices or systems. For example, controller 410 may receive one or more input signals from angle sensor 105, and may use the one or more input signals to generate an output signal comprising the angular position of magnet 110 and/or the rotatable object to which magnet 110 is connected.

The number and arrangement of apparatuses shown in FIG. 4 are provided as an example. In practice, there may be additional apparatuses, fewer apparatuses, different apparatuses, or differently arranged apparatuses than those shown in FIG. 4. Furthermore, two or more apparatuses shown in FIG. 4 may be implemented within a single apparatus, or a single apparatus shown in FIG. 4 may be implemented as multiple, distributed apparatuses. Additionally, or alternatively, a set of apparatuses (e.g., one or more apparatuses) of environment 400 may perform one or more functions described as being performed by another set of apparatuses of environment 400.

Figure 5:
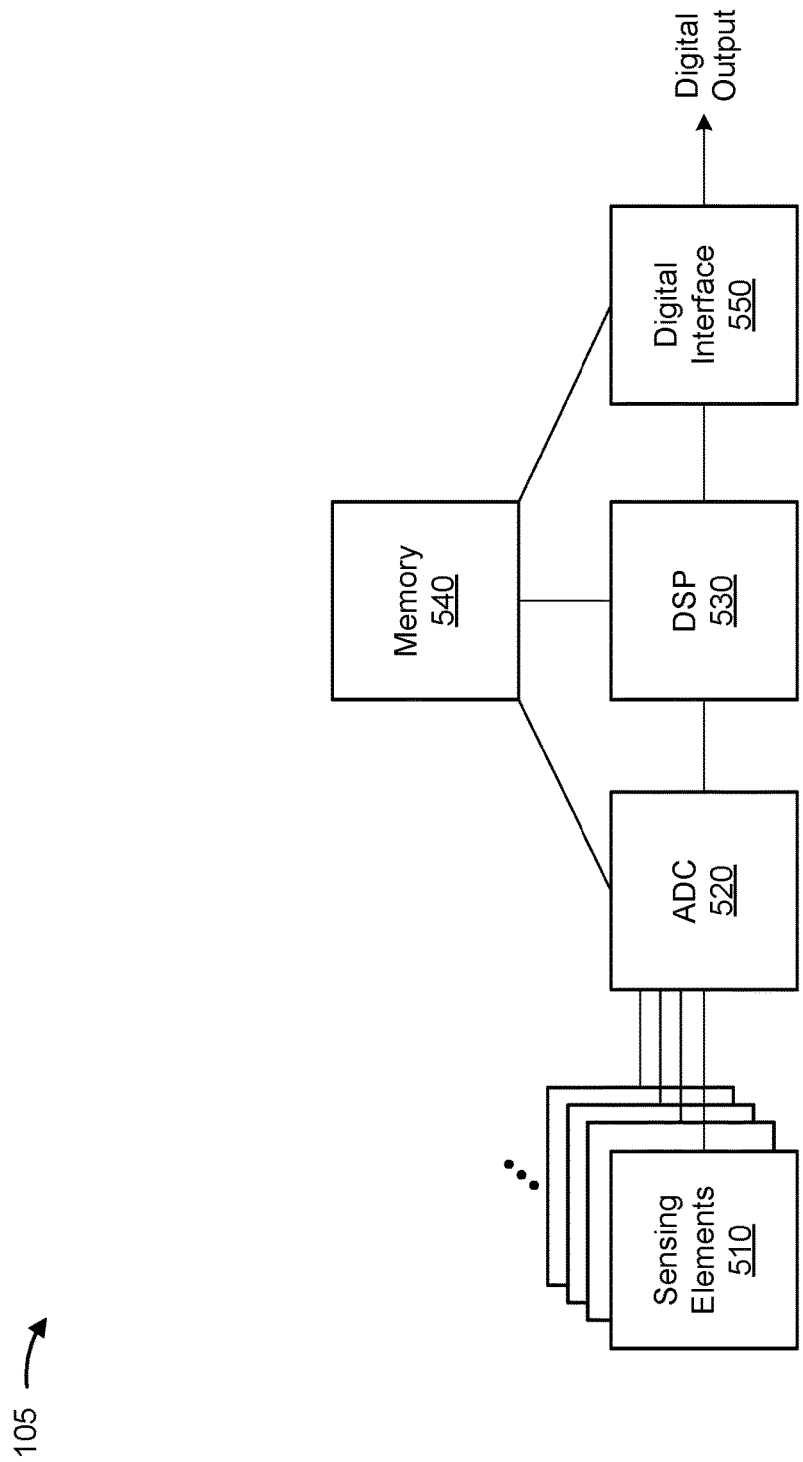
FIG. 5 is a diagram of example components of one or more devices of FIG. 4.

FIG. 5 is a diagram of example components of angle sensor 105 included in example environment 400 of FIG. 4. As shown, angle sensor 105 may include a group of sensing elements 510, an analog-to-digital convertor (ADC) 520, a digital signal processor (DSP) 530, an optional memory component 540, and a digital interface 550.

Sensing element 510 includes one or more apparatuses for sensing an amplitude of a component of a magnetic field present at angle sensor 105 (e.g., the magnetic field generated by magnet 110). For example, sensing element 510 may include a Hall sensor that operates based on a Hall effect. As another example, sensing element 510 may include a magnetoresistive (MR) sensor, comprising a magnetoresistive material (e.g., nickel iron (NiFe)), where the electrical resistance of the magnetoresistive material may depend on a strength and/or a direction of the magnetic field present at the magnetoresistive material. Here, sensing element 510 may measure magnetoresistance based on an anisotropic magnetoresistance (AMR) effect, a giant magnetoresistance (GMR) effect, a tunnel magnetoresistance (TMR) effect, or the like. As an additional example, sensing element 510 may include a variable reluctance (VR) sensor that operates based on induction. In some implementations, sensing element 510 may include a temperature sensing element that is associated with measuring a temperature at or near angle sensor 105.

ADC 520 includes an analog-to-digital converter that converts an analog signal from the one or more sensing elements 510 to a digital signal. For example, ADC 520 may convert analog signals, received from the one or more sensing elements 510, into digital signals to be processed by DSP 530. ADC 520 may provide the digital signals to DSP 530. In some implementations, angle sensor 105 may include one or more ADCs 520.

DSP 530 includes a digital signal processing device or a collection of digital signal processing devices (i.e., one or more processors). In some implementations, DSP 530 may receive digital signals from ADC 520 and may process the digital signals to form output signals (e.g., destined for controller 410 as shown in FIG. 2), such as output signals associated with determining the rotation angle of magnet 110 rotating with a rotatable object. In some implementations, DSP 530 may include one or more processors, such as a central processing unit (CPU), an accelerated processing unit (APU), a microprocessor, a microcontroller, a field-programmable gate array (FPGA), an application-specific integrated circuit (ASIC), or another type of processing component.

Optional memory component 540 includes a read only memory (ROM) (e.g., an EEPROM), a random access memory (RANI), and/or another type of dynamic or static storage device (e.g., a flash memory, a magnetic memory, an optical memory, etc.) that stores information and/or instructions for use by angle sensor 105. In some implementations, optional memory component 540 may store information associated with processing performed by DSP 530. In some implementations, angle sensor 105 may perform processes described herein based on executing software instructions stored by a non-transitory computer-readable medium, such as optional memory component 540. A computer-readable medium, as used herein, is a non-transitory memory device. Additionally, or alternatively, optional memory component 540 may store configurational values or parameters for sensing elements 510 and/or information for one or more other components of angle sensor 105, such as ADC 520 or digital interface 550.

Digital interface 550 includes an interface via which angle sensor 105 may receive and/or provide information from and/or to another device, such as controller 410 (see FIG. 4). For example, digital interface 550 may provide the output signal, determined by DSP 530, to controller 410 and may further receive information from the controller 410.

The number and arrangement of components shown in FIG. 5 are provided as an example. In practice, angle sensor 105 may include additional components, fewer components, different components, or differently arranged components than those shown in FIG. 5. Additionally, or alternatively, a set of components (e.g., one or more components) of angle sensor 105 may perform one or more functions described as being performed by another set of components of angle sensor 105.

Figure 6:
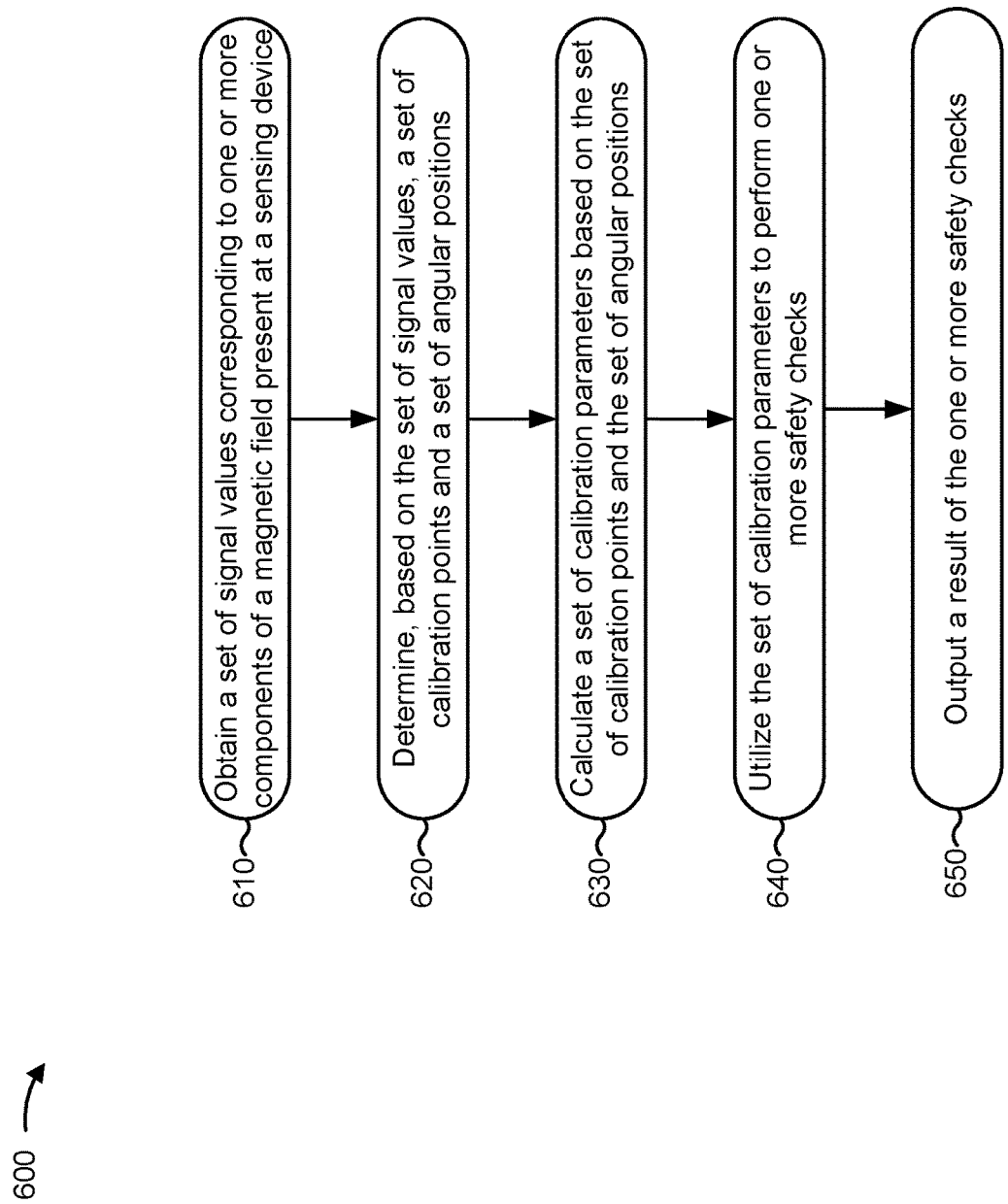
FIG. 6 is a flowchart of an example process relating to angle sensor calibration for safety measure without full rotation.

FIG. 6 is a flowchart of an example process 600 associated with angle sensor calibration for safety measure without full rotation. In some implementations, one or more process blocks of FIG. 6 may be performed by a sensing device (e.g., angle sensor 105). In some implementations, one or more process blocks of FIG. 6 may be performed by another device or a group of devices separate from or including the sensing device, such as a controller (e.g., controller 410). Additionally, or alternatively, one or more process blocks of FIG. 6 may be performed by one or more components of angle sensor 105, such as sensing elements 510, ADC 520, DSP 530, memory 540, and/or digital interface 550.

As shown in FIG. 6, process 600 may include obtaining a set of signal values corresponding to one or more components of the magnetic field present at the sensing device (block 610). For example, the sensing device may obtain a set of signal values. The sensing device may be configured to sense a magnetic field present at the sensing device and collect sensor data based on the magnetic field. The sensor data may be associated with less than a 360 degree measurement range and may be included in the sensor data collected by the sensing device. The set of signal values may correspond to one or more components of the magnetic field present at the sensing device, as described above.

As further shown in FIG. 6, process 600 may include determining, based on the set of signal values, a set of calibration points and a set of angular positions (block 620). For example, the sensing device may determine, based on the set of signal values, a set of calibration points and a set of angular positions, as described above. In some implementations, each calibration point of the set of calibration points may be associated with a respective angular position of the set of angular positions.

As further shown in FIG. 6, process 600 may include calculating a set of calibration parameters based on the set of calibration points and the set of angular positions (block 630). For example, the sensing device may calculate a set of calibration parameters based on the set of calibration points and the set of angular positions, as described above.

As further shown in FIG. 6, process 600 may include utilizing the set of calibration parameters to perform one or more safety checks (block 640). For example, the sensing device may utilize the set of calibration parameters to perform one or more safety checks, as described above.

As further shown in FIG. 6, process 600 may include outputting a result of the one or more safety checks (block 650). For example, the sensing device may output a result of the one or more safety checks, as described above.

Process 600 may include additional implementations, such as any single implementation or any combination of implementations described below and/or in connection with one or more other processes described elsewhere herein.

In a first implementation, calculating the set of calibration parameters includes performing ellipse regression by solving a set of overdetermined equations, and calculating the set of calibration parameters based on performing the ellipse regression.

In a second implementation, a result of performing the ellipse regression includes a matrix of values, the matrix of values includes a first value in a first row and a first column of the matrix of values, and a second value in a second row and the first column of the matrix of values, and calculating the set of calibration parameters comprises calculating a calibration parameter, of the set of calibration parameters, based on calculating an inverse tangent of a negative of the second value divided by the first value.

In a third implementation, the calibration parameter is a first calibration parameter, and calculating the set of calibration parameters further comprises calculating a cosine of the first calibration parameter to determine a third value, calculating a sine of the first calibration parameter to determine a fourth value, determining a fifth value based on subtracting the fourth value from the third value, and calculating a second calibration parameter, of the set of calibration parameters, based on dividing a sum of the first value and the second value by the fifth value.

In a fourth implementation, a result of performing the ellipse regression includes a matrix of values, wherein the matrix of values includes a first value in a first row and a second column of the matrix of values, and a second value in a second row and the second column of the matrix of values, and wherein calculating the set of calibration parameters comprises calculating a third value based on dividing the first value by the second value, and calculating a calibration parameter, of the set of calibration parameters, based on calculating an inverse tangent of the third value.

In a fifth implementation, the calibration parameter is a first calibration parameter, and calculating the set of calibration parameters further comprises calculating a cosine of the first calibration parameter to determine a fourth value, calculating a sine of the first calibration parameter to determine a fifth value, and calculating a second calibration parameter, of the set of calibration parameters, based on dividing a sum of the first value and the second value by a sum of the fourth value and the fifth value.

In a sixth implementation, a result of performing the ellipse regression includes a matrix of values, wherein the matrix of values includes a first value in a third row and a first column of the matrix of values, and wherein calculating the set of calibration parameters comprises calculating a calibration parameter, of the set of calibration parameters, corresponding to the first value.

In a seventh implementation, a result of performing the ellipse regression includes a matrix of values, wherein the matrix of values includes a first value in a third row and a second column of the matrix of values, and wherein calculating the set of calibration parameters comprises calculating a calibration parameter, of the set of calibration parameters, corresponding to the first value.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, and/or a combination of hardware and software. It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A method, comprising:
    sensing, by a magnetic field sensing device, a magnetic field present at the magnetic field sensing device to generate a first set of signal values corresponding to a first magnetic field component of the magnetic field and a second set of signal values corresponding to a second magnetic field component of the magnetic field, wherein the first magnetic field component is perpendicular to the second magnetic field component, wherein the magnetic field sensing device is configured to sense the magnetic field present at the magnetic field sensing device and collect the first set of signal values and the second set of signal values as sensor data, wherein the sensor data is obtained during a rotation of the magnetic field during which the rotation of the magnetic field is rotated in a measurement range that is less than 360 degrees;
    determining, by the magnetic field sensing device, a set of calibration points and a set of angular positions based on the first set of signal values and the second set of signal values, wherein each calibration point of the set of calibration points is determined based on a respective first signal value of the first set of signal values and a respective second signal value of the second set of signal values, and wherein each calibration point of the set of calibration points is associated with a respective angular position of the set of angular positions;
    calculating, by the magnetic field sensing device, a set of calibration parameters based on the set of calibration points and the set of angular positions;
    utilizing, by the magnetic field sensing device, the set of calibration parameters to perform one or more safety checks; and
    outputting, by the magnetic field sensing device, a result of the one or more safety checks.

2. A method, comprising:
    obtaining, by a sensing device, a set of signal values, the sensing device being configured to sense a magnetic field present at the sensing device and collect sensor data based on the magnetic field, the sensor data being associated with less than a 360 degree measurement range, the set of signal values being included in the sensor data collected by the sensing device, and the set of signal values corresponding to one or more components of the magnetic field present at the sensing device;
    determining, by the sensing device and based on the set of signal values, a set of calibration points and a set of angular positions, each calibration point of the set of calibration points being associated with a respective angular position of the set of angular positions;
    calculating, by the sensing device, a set of calibration parameters based on the set of calibration points and the set of angular positions;
    utilizing, by the sensing device, the set of calibration parameters to perform one or more safety checks; and
    outputting, by the sensing device, a result of the one or more safety checks,
    wherein calculating the set of calibration parameters includes:
        performing ellipse regression by solving a set of overdetermined equations; and
        calculating the set of calibration parameters based on performing the ellipse regression.

3. The method of claim 2, wherein a result of performing the ellipse regression includes a matrix of values, wherein the matrix of values includes:
    a first value in a third row and a first column of the matrix of values; and
    wherein calculating the set of calibration parameters comprises:
        calculating a calibration parameter, of the set of calibration parameters, corresponding to the first value.

4. The method of claim 2, wherein a result of performing the ellipse regression includes a matrix of values, wherein the matrix of values includes:
    a first value in a third row and a second column of the matrix of values; and
    wherein calculating the set of calibration parameters comprises:
        calculating a calibration parameter, of the set of calibration parameters, corresponding to the first value.

5. The method of claim 2, wherein a result of performing the ellipse regression includes a matrix of values, and wherein the matrix of values includes:
    a first value in a first row and a first column of the matrix of values; and
    a second value in a second row and the first column of the matrix of values; and
    wherein calculating the set of calibration parameters comprises:
        calculating a calibration parameter, of the set of calibration parameters, based on calculating an inverse tangent of a negative of the second value divided by the first value.

6. The method of claim 5, wherein the calibration parameter is a first calibration parameter, and wherein calculating the set of calibration parameters further comprises:
    calculating a cosine of the first calibration parameter to determine a third value;
    calculating a sine of the first calibration parameter to determine a fourth value;
    determining a fifth value based on subtracting the fourth value from the third value; and
    calculating a second calibration parameter, of the set of calibration parameters, based on dividing a sum of the first value and the second value by the fifth value.

7. The method of claim 2, wherein a result of performing the ellipse regression includes a matrix of values, wherein the matrix of values includes:

a first value in a first row and a second column of the matrix of values; and a second value in a second row and the second column of the matrix of values; and wherein calculating the set of calibration parameters comprises:

calculating a third value based on dividing the first value by the second value; and calculating a calibration parameter, of the set of calibration parameters, based on calculating an inverse tangent of the third value.

8. The method of claim 7, wherein the calibration parameter is a first calibration parameter, and wherein calculating the set of calibration parameters further comprises:

calculating a cosine of the first calibration parameter to determine a fourth value;

calculating a sine of the first calibration parameter to determine a fifth value; and calculating a second calibration parameter, of the set of calibration parameters, based on dividing a sum of the first value and the second value by a sum of the fourth value and the fifth value.

9. An angle sensor, comprising:

one or more sensing elements configured to:

sense a magnetic field present at the one or more sensing elements;

generate a first set of signal values corresponding to a first magnetic field component of the magnetic field and a second set of signal values corresponding to a second magnetic field component of the magnetic field, wherein the first magnetic field component is perpendicular to the second magnetic field component;

collect the first set of signal values and the second set of signal values as sensor data based on the magnetic field, wherein the sensor data is collected during a rotation of the magnetic field during which the rotation of the magnetic field is rotated in a measurement range that is less than 360 degrees; and one or more processors configured to:

obtain the first set of signal values and the second set of signal values included in the sensor data determine, based on the first set of signal values and the second set of signal values, a set of calibration points and a set of angular positions, wherein each calibration point of the set of calibration points is determined based on a respective first signal value of the first set of signal values and a respective second signal value of the second set of signal values, and wherein each calibration point of the set of calibration points is associated with a respective angular position of the set of angular positions;

calculate a set of calibration parameters based on the set of calibration points and the set of angular positions;

utilize the set of calibration points to perform one or more safety checks; and output a result of the one or more safety checks.

10. The angle sensor of claim 9, wherein the one or more processors, to calculate the set of calibration parameters, are configured to:

perform ellipse regression by solving a set of overdetermined equations; and calculate the set of calibration parameters based on performing the ellipse regression.

11. The angle sensor of claim 10, wherein a result of performing the ellipse regression includes a matrix of values, wherein the matrix of values includes:

a first value in a third row and a first column of the matrix of values; and wherein the one or more processors, to calculate the set of calibration parameters, are configured to:

calculate a calibration parameter, of the set of calibration parameters, corresponding to the first value.

12. The angle sensor of claim 10, wherein a result of performing the ellipse regression includes a matrix of values, wherein the matrix of values includes:

a first value in a third row and a second column of the matrix of values; and wherein the one or more processors, to calculate the set of calibration parameters, are configured to:

calculate a calibration parameter, of the set of calibration parameters, corresponding to the first value.

13. The angle sensor of claim 10, wherein a result of performing the ellipse regression includes a matrix of values, wherein the matrix of values includes:

a first value in a first row and a first column of the matrix of values; and a second value in a second row and the first column of the matrix of values; and wherein the one or more processors, to calculate the set of calibration parameters, are configured to:

calculate a third value based on dividing a negative of the second value by the first value; and calculate a calibration parameter, of the set of calibration parameters, based on calculating an inverse tangent of the third value.

14. The angle sensor of claim 13, wherein the calibration parameter is a first calibration parameter, and wherein the one or more processors, to calculate the set of calibration parameters, are configured further to:

calculate a cosine of the first calibration parameter to determine a fourth value;

calculate a sine of the first calibration parameter to determine a fifth value;

determine a sixth value based on subtracting the fifth value from the fourth value; and calculate a second calibration parameter, of the set of calibration parameters, based on dividing a sum of the first value and the second value by the sixth value.

15. The angle sensor of claim 10, wherein a result of performing the ellipse regression includes a matrix of values, wherein the matrix of values includes:

a first value in a first row and a second column of the matrix of values; and a second value in a second row and the second column of the matrix of values; and wherein the one or more processors, to calculate the set of calibration parameters, are configured to:

calculate a calibration parameter, of the set of calibration parameters, based on calculating an inverse tangent of the first value divided by the second value.

16. The angle sensor of claim 15, wherein the calibration parameter is a first calibration parameter, and wherein the one or more processors, to calculate the set of calibration parameters, are configured further to:

calculate a cosine of the first calibration parameter to determine a third value;

calculate a sine of the first calibration parameter to determine a fourth value; and calculate a second calibration parameter, of the set of calibration parameters, based on dividing a sum of the first value and the second value by a sum of the third value and the fourth value.

17. A system, comprising:
an angle sensor configured to:
- sense a magnetic field present at the angle sensor; and
- generate a first set of signal values corresponding to a first magnetic field component of the magnetic field and a second set of signal values corresponding to a second magnetic field component of the magnetic field, wherein the first magnetic field component is perpendicular to the second magnetic field component;
- collect the first set of signal values and the second set of signal values as sensor data based on the magnetic field, the sensor data being associated with less than a 360 degree measurement range wherein the sensor data is collected during a rotation of the magnetic field during which the rotation of the magnetic field is rotated in a measurement range that is less than 360 degrees; and one or more processors configured to:
- obtain the first set of signal values and the second set of signal values included in the sensor data collected by the angle sensor;
- determine, based on the first set of signal values and the second set of signal values, a set of calibration points and a set of angular positions, wherein each calibration point of the set of calibration points is determined based on a respective first signal value of the first set of signal values and a respective second signal value of the second set of signal values, and wherein each calibration point of the set of calibration points is associated with a respective angular position of the set of angular positions;
- calculate a set of calibration parameters based on the set of calibration points and the set of angular positions;
- utilize the set of calibration parameters to perform one or more safety checks; and
- output a result of the one or more safety checks.

18. The system of claim 17, wherein the one or more processors, to calculate the set of calibration parameters, are configured to:
- perform ellipse regression by solving a set of overdetermined equations; and
- calculate the set of calibration parameters based on performing the ellipse regression.

19. The system of claim 18, wherein a result of performing the ellipse regression includes a matrix of values, wherein the matrix of values includes:
- a first value in a first row and a first column of the matrix of values; and
- a second value in a second row and the first column of the matrix of values; and
- wherein the one or more processors, to calculate the set of calibration parameters, are configured to:
  - calculate a first calibration parameter, of the set of calibration parameters, based on calculating an inverse tangent of third value,
    - wherein the third value corresponds to a negative of the second value divided by the first value;
  - calculate a cosine of the first calibration parameter to determine a fourth value;
  - calculate a sine of the first calibration parameter to determine a fifth value;
  - determine a sixth value based on subtracting the fifth value from the fourth value;

and
- calculate a second calibration parameter, of the set of calibration parameters, based on dividing a sum of the first value and the second value by the sixth value.

20. The system of claim 18, wherein a result of performing the ellipse regression includes a matrix of values, wherein the matrix of values includes:
- a first value in a first row and a second column of the matrix of values; and
- a second value in a second row and the second column of the matrix of values; and
- wherein the one or more processors, to calculate the set of calibration parameters, are configured to:
  - calculate a first calibration parameter, of the set of calibration parameters, based on calculating an inverse tangent of the first value divided by the second value;
  - calculate a cosine of the first calibration parameter to determine a third value;
  - calculate a sine of the first calibration parameter to determine a fourth value; and
  - calculate a second calibration parameter, of the set of calibration parameters, based on dividing a sum of the first value and the second value by a sum of the third value and the fourth value.

* * * * *